United States Patent [19]
Desblache et al.

[11] 3,972,000
[45] July 27, 1976

[54] PHASE FILTER FOR REDUCING THE EFFECTS OF THE NOISE COMPONENTS ALTERING DISCRETE PHASE MODULATED SIGNALS

[75] Inventors: André Eugené Desblache, Nice, France; Thomas Edwin Stern, Bronx, N.Y.; Philippe Emmanuel Thirion, St-Paul-de-Vence, France

[73] Assignee: International Business Machines Corporation, Armonk, N.Y.

[22] Filed: July 15, 1975

[21] Appl. No.: 596,557

[30] Foreign Application Priority Data
Aug. 30, 1974 France .............................. 74.30001

[52] U.S. Cl. ................................ 329/105; 178/88; 325/323; 328/109; 329/136; 329/178
[51] Int. Cl.² ...................... H03D 3/00; H04B 1/10; H04L 27/22
[58] Field of Search ........... 329/104, 105, 110, 136, 329/168, 178; 325/42, 323, 324; 328/109; 178/88

[56] References Cited
UNITED STATES PATENTS

| | | | |
|---|---|---|---|
| 3,766,480 | 10/1973 | Belloc et al. | 329/110 X |
| 3,855,539 | 12/1974 | Croisier | 329/104 |

Primary Examiner—Siegfried H. Grimm
Attorney, Agent, or Firm—Jack M. Arnold

[57] ABSTRACT

A digital phase filter including two decision filters connected in cascade or parallel for minimizing the noise components in a received phase modulated digital signal. The first decision filter cancels the residual noise component representing the phase intercept component and the phase shift component introduced by frequency shift, and the second decision filter minimizes the random noise component representing phase jitter and white noise.

9 Claims, 15 Drawing Figures

PHASE FILTER FOR REDUCING THE EFFECTS OF THE NOISE COMPONENTS ALTERING DISCRETE PHASE MODULATED SIGNALS

BACKGROUND OF THE INVENTION

This invention relates to digital data transmission systems and more particularly, to a phase filter for reducing the effects of the noise components altering the signals transmitted through a system in which the phase of the transmitted signals is modulated by discrete values, at discrete times.

Phase modulation is a technique widely used in data transmission systems and a detailed description thereof is provided, for example, in "Data Transmission" by W. R. Bennett and J. R. Davey, chapter 10, McGraw-Hill, New York 1965 and "Principles of Data Communications" by R. W. Lucky, J. Salz and E. J. Weldon Jr., chapter 9, McGraw-Hill, New York 1968. In those digital data transmission systems that utilize phase modulation, the digital data to be transmitted modulate the phase of a carrier at particular instants or sampling times. The direct modulation method, called "Coherent Phase Modulation", consists in making a predetermined phase absolute value to correspond to a data group or character. For instance, in an eight-phase system, i.e., in a system in which the phase of the transmitted signal can assume eight distinct discrete values, it is possible to make the eight phase absolute values $\pi/8, 3\pi/8, \ldots, 15\pi/8$, respectively, to correspond to the eight characters 000, 001, 011, 010, 110, 111, 101 and 100 as shown in the diagram of FIG. 1a. The modulation method the most currently used, called "Differential Phase Modulation", consists in making a phase change rather than a phase absolute value to correspond to a character. Always in an eight-phase system, it is possible to make phase variations $\Delta\phi = \pi/8, 3\pi/8, \ldots, 15\pi/8$ to correspond to the eight characters 000, 001, 011, ..., 100. This type of modulation can also be illustrated by the diagram of FIG. 1a by taking the phase value of the signal emitted at the preceding sampling time as reference axis OX. The so-modulated carrier frequency is sent, through a transmission medium, to a receiver coupled thereto. At the receiver, the phase value of the signal received at sampling times is detected, and then the value of the transmitted data is extracted therefrom. This extraction is generally done by comparing the phase of the signal received at a given sampling time with a reference phase available in the receiver or with the phase of the signal received at the preceding sampling time according to the use of a coherent or differential detection, as described in the above-referenced books.

It is to be noted that phase modulation as briefly described above, is not the only one process for transmitting digital data, in which the phase of the transmitted signals represents the data. For instance, it is the case of the quadrature amplitude modulation a description of which can be found in the above-referenced book by R. W. Lucky et al, chapter 7 and more particularly in paragraph 7.1.5. Briefly, the quadrature amplitude modulation consists in modulating the amplitude of two carriers in quadrature by discrete values, said carriers being emitted in the same time. The following table shows the correspondence between the digital characters, the amplitude of each of the carriers in quadrature A and B and the phase and the amplitude of the signal resulting from the combination of these carriers, in an eight-state system illustrated by the diagram of FIG. 1b.

| Digital characters | Amplitude of A | Amplitude of B | Phase of the resulting signal | Amplitude of the resulting signal |
| --- | --- | --- | --- | --- |
| 000 | +3 | 0  | 0      | +3       |
| 001 | +1 | +1 | $\pi/4$  | $+\sqrt{2}$ |
| 011 | 0  | +3 | $2\pi/4$ | +3       |
| 010 | −1 | +1 | $3\pi/4$ | $+\sqrt{2}$ |
| 110 | −3 | 0  | $4\pi/4$ | +3       |
| 111 | −1 | −1 | $5\pi/4$ | $+\sqrt{2}$ |
| 101 | 0  | −3 | $6\pi/4$ | +3       |
| 100 | +1 | −1 | $7\pi/4$ | $+\sqrt{2}$ |

From this table, it appears that, in this example, the data can be directly derived from the value of the phase of the emitted resulting signal.

It would be desirable if the emitted signals should be received without distortion in the receiver. In practice, however, the transmission media introduce disturbances such as intersymbol interference and the noise components mainly due to frequency shift, phase intercept, phase jitter and white noise, which disturbances alter the emitted signals when transmitted through the transmission medium.

Intersymbol interference is due to an interaction between successive emitted signals, which interaction is caused by amplitude and phase distortions introduced by the transmission medium. When intersymbol interference appreciably affects the quality of the received signals, it is cancelled or reduced by an appropriate device called an "Equalizer". Within the scope of this invention, it is assumed that intersymbol interference is cancelled by an appropriate equalizer, as necessary.

Frequency shift is a disturbance affecting the emitted signals when they are transmitted through a transmission medium in which they are submitted to an intermediate processing and more particularly, when telephone lines are used as the transmission medium. Said intermediate processing mainly includes the transposition of the emitted signals from one frequency band to another as required by the public network. A frequency shift $f_s$ introduces a phase shift $\phi_s = 2\pi f_s t$, where $t$ is the time, which phase shift directly affects the phase of the received signal.

Phase intercept is due to the presence of a difference between the actual phase of a frequency and the phase corresponding to the ideal channel phase/frequency characteristic, at the ends of the frequency bandwidth of the transmission channel. This phase intercept introduces an arbitrary constant in the received phase value.

Phase jitter results from a random noise frequency modulation of the signals when passing through the transmission medium. Often, it is due to the variation of the power sources of the devices used to carry out the above-indicated intermediate processing.

White noise is due to the additive noise in the transmission medium and to the residual intersymbol interference. It is characterized by a flat frequency spectrum with equal contributions for all the frequencies, but in which the various frequencies exhibit random phases.

These noise components have practically no effect in the low speed digital data transmission systems but avoid correct data detection in high speed systems. In those systems using phase modulation, an increase of the transmission speed is generally obtained by increasing the number of the distinct discrete values which can be assumed by the phase of the emitted signal, which increase appears as a decrease of the gap between two adjoining phase values. For instance, in a four-phase system, this gap is of 90°, but it is only of 22.5° in a sixteen-phase system. Then it is often not possible to discriminate between two possible phase values in presence of the various above-indicated disturbances and it becomes imperative to provide a device to cancel or reduce the effects of these noise components before detecting data.

U.S. Pat. No. 3,855,539, filed Mar. 16, 1973 on behalf of Alain Croisier, which patent is assigned to the assignee of the present invention, describes a method and a device for reducing the effects of the noise components altering the phase of discrete phase modulated signals. According to this method, a correction value is subtracted from the received signal phase value. The result of this subtraction is multiplied by a first factor proportional to the number of distinct discrete values that the phase of the emitted signal can assume. The integral part of this product represents the data while the fractional part is used to provide said correction value. Said correction value is obtained by multiplying said fractional part by a second factor and by integrating the result of this last multiplication. Controlling the value of the second factor enables to minimize the effects of the various above-indicated components selectively. However, this method shows a drawback consisting in the fact that the reduction of the effect of the phase jitter is necessarily accompanied by a decrease of the performance with respect to the white noise. The curves shown in FIG. 3 of the above-indicated patent application enables one to appreciate the difficulty encountered to find a good decrease of phase jitter/increase of white noise compromise.

One of the objects of this invention is to overcome this drawback by providing an optimum phase filter for minimizing, the effects of phase intercept, frequency shift, phase jitter and white noise altering discrete phase modulated signals.

Another object of this invention is to provide an adaptive phase filter allowing to reduce the phase jitter effect to a minimum, whatever the noise modulation frequency causing said jitter, may be.

The objects of this invention are generally obtained by providing a phase filter including two decision filters which can be linked through a cascade or a parallel connection. The first decision filter cancels the phase intercept component and the phase shift component introduced by the frequency shift, and the second decision filter minimizes the random component representing phase jitter and white noise. In the first decision filter, a first error signal corresponding to an estimated value of the phase intercept and phase shift components is subtracted from the phase value of the received signal. The result of this first subtraction is applied to a detector-separator which separates the data and the residual noise component. The residual noise component is applied to a linear filter generating from the previous residual noise components, the estimated value of the phase intercept and phase shift components. In the second decision filter, a second error signal corresponding to an estimated value of the random component is subtracted from the result of the first subtraction. The result of this second subtraction is applied to a detector-separator which fetches the data and the residual random component out. Said component is applied to a linear filter which generates from the previous residual random components, the estimated value of the random component. When the phase jitter characteristics are unknown or if they are varying in time, the estimated value of the random component can be obtained by an adaptive predictive filter.

These and other objects, advantages and features of the present invention will become more readily apparent from the following specification when taken in conjunction with the drawings.

SUMMARY OF THE INVENTION

According to the present invention, a phase filter is disclosed which minimizes the effects of noise components altering the value of the phase of a digital signal in a digital data transmission system in which the phase of the digital signal can assume Q distinct values representing the data, with the phase filter including two decision filters. The first decision filter cancels residual noise components representing the phase intercept component and the phase shift component introduced by frequency shift, and the second decision filter minimizes the random noise component representing phase jitter and white noise. The first decision filter includes a first means for providing a first difference signal in response to taking the difference between the received digital signal and a first error signal corresponding to an estimated value of the residual noise component. Also included is a first detector which is responsive to the first difference signal for separating the data portion from the residual noise portion of said first difference signal. Further included is a first linear filter which is responsive to the residual noise portion of the first difference signal for generating the first error signal. The second decision filter includes a second means for providing a second difference signal in response to taking the difference between the first difference signal and a second error signal corresponding to an estimated value of the random noise component. Also included is a second detector which is responsive to the second difference signal for separating the data portion from the random noise portion of the second difference signal, with a data representative signal being provided at a first output and a random noise representative signal being provided at a second output. Further included is a second linear filter which is responsive to the random noise representative signal for generating the second error signal.

DESCRIPTION OF THE PREFERRED EMBODIMENT

Figure 1A:
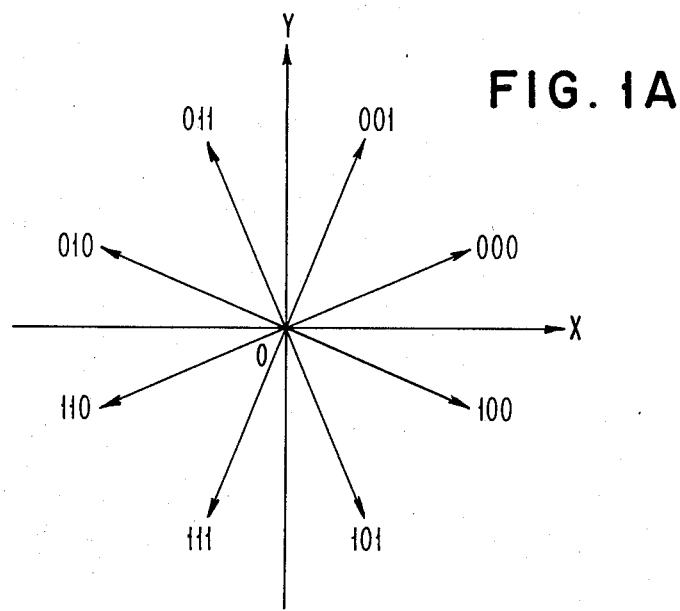
FIGS. 1A and 1B show diagrams respectively illustrating an eight-phase modulation and an eight-state quadrature amplitude modulation.
Figure 1B:
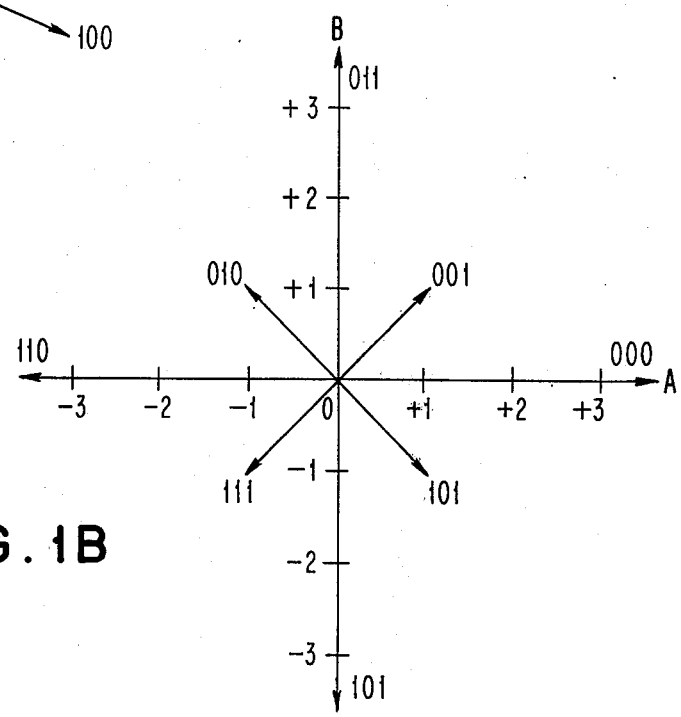

The phase filter of the invention operating on sequences of discrete values, the Z-transform will be used as a mathematical tool. For the description of the theory of the Z-transform and of its applications, it is possible to refer, for example, to the articles entitled: "Z-Transforms and Their Applications in Control Engineering" by Y. Azar, published in "The Radio and Electronic Engineer" July 1965, pages 53 to 57 and "Digital Filter Design Techniques in the Frequency Domain" by C. M. Rader and B. Gold, "Proceedings of the IEEE", Vol. 55, No. 2, February 1967, pages 149 to 171, and for a detailed study, it would be possible to refer, for example, to "Theory and Application of the Z-Transform Method" by E. I. Jury, John Wiley, New York, 1967.

To relieve the reader of the necessity of referring to other documents, a summary of the Z-Transform theory and the results which will be used in this description is given in the following.

Suppose a linear system characterized in the time-domain by its continuous impulse response $h(t)$. In response to a continuous input signal $s(t)$, this filter provides a continuous output signal $g(t)$ defined by the following convolution relation $$g(t) = \int_{-\infty}^{+\infty} h(y) \, s(t-y) \, dy \quad (1)$$

If the Laplace transformation is used in the frequency domain, relation (1) becomes $$G(p) = H(p) \, S(p) \quad (2)$$

with $p =$ complex frequency
in which $G(p)$, $H(p)$ and $S(p)$ are the Laplace transforms of $g(t)$, $h(t)$ and $s(t)$, respectively. $H(p)$ is called the "transfer function" of the system. The Laplace transform is used very much in studying continuous systems since it allows to replace the integration operation defined in (1) by the simple algebraic operation defined in (2).

The Z-transform operates as the Laplace transform, in studying discrete systems. By definition, the Z-transform of the sequence of discrete values $s(nT)$, $n$=positive integer, and T=appearance periods of the discrete value, is:

$$S(z) = \sum_{n=0}^{+\infty} s(nT) \, z^{-n} \quad (3)$$

where $z$ is a complex variable $z=e^{pT}$.
Relation (2) becomes $$G(z) = H(z) \, S(z) \quad (4)$$

where $S(z)$ and $G(z)$ are the Z-transforms of the sequences of discrete values $s(nT)$ and $g(nT)$, and $H(z)$ is the Z-transform of discrete impulse response $h(nT)$.

Thus, the Z-transform of the output sequence of a discrete filter is the product of the Z-transform of the input sequence and function $H(z)$ characterizing the filter, which function is similar to a transfer function.

A table for converting the sequences of values and their Z-transforms can be found, for example, in the above-indicated book by E. I. Jury.

It should be simply noted here that the Z-transform of sequence $x(nT)$ defined by $x(nT) = 0$ for $n < 0$ $x(nT) = 1$ for $n \geq 0$ is $$X(z) = \sum_{n=0}^{+\infty} z^{-n} = \frac{1}{1-z^{-1}} \quad (5)$$

the Z-transform of a sequence delayed by an elementary delay T is equal to the Z-transform of the initial sequence multiplied by $z^{-1}$.

The phase filter according to the invention will be described, now, in a cascade form and a parallel form, successively.

Figure 2:
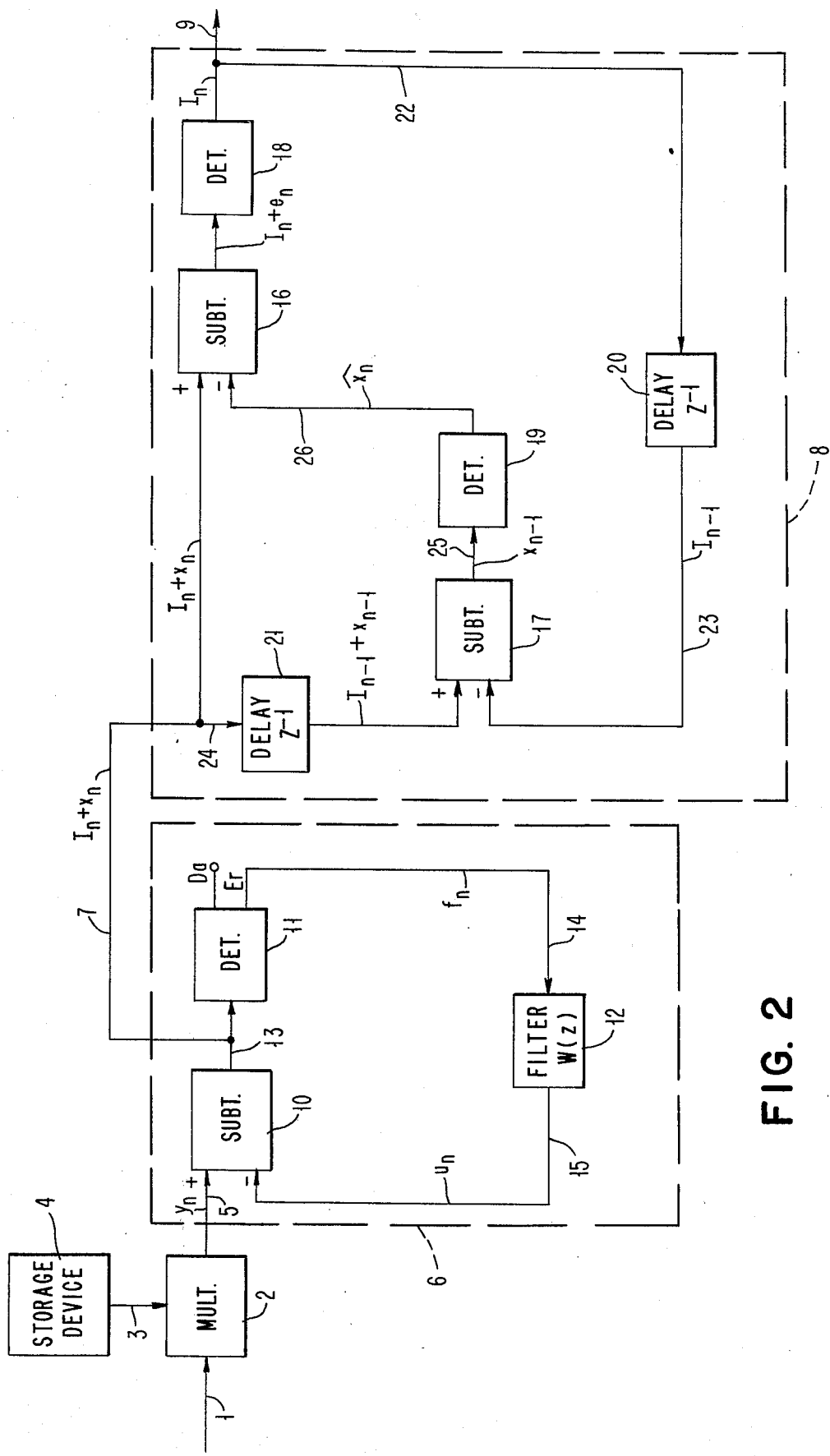
FIG. 2 is a schematic illustration of a phase filter in cascade form according to this invention.

Referring to FIG. 2 which shows the phase filter in cascade form, it is seen that the discrete value of phase $\phi'_n$ fetched out from the received signal and which is supposed to be digitally encoded without limiting the scope of the invention, is applied to one of the inputs of a binary multiplier 2, via line 1. The second input of multiplier 2 is connected to the output of a storage element 4 which can be, for example, a binary register, or a simple prearranged connection assembly, via line 3. The output of multiplier 2 is connected via line 5 to the input of a first decision filter 6 the output of which is, in turn, connected via line 7, to the input of a second decision filter 8 which delivers as an output on line 9, the signals representing the detected data. The first decision filter 6 includes a binary subtractor 10, a detector-separator 11 and a digital linear filter 12. The output of multiplier 2 is connected via line 5 to the (+) input of subtractor 10 the output of which is connected via line 13 to the input of detector-separator 11 which will be described with more details with reference to FIG. 11. Output Er of detector-separator 11 is connected via line 14 to the input of filter 12 the output of which is connected via line 15 to the (−) input of subtractor 10. Second decision filter 8 includes two binary subtractors 16 and 17, a detector-separator 18, a digital predictive filter 19 and two delay elements 20 and 21, each introducing an elementary delay T equal to the sampling time period. The output of subtractor 10 of decision filter 6 is connected via line 7 to the (+) input of subtractor 16 the output of which is connected to the input of detector-separator 18 whose output is connected to output line 9. The output of detector-separator 18, is further connected via line 22, to the input of delay element 20 the output of which is connected to the (−) input of subtractor 17 via line 23. The (+) input of subtractor 17 is connected to the output of delay element 21 whose input is connected to line 7 via line 24. The output of subtractor 17 is connected via line 25, to the input of predictive filter 19 the output of which is connected to the (−) input of subtractor 18 via line 26.

The operation of the device schematically shown on FIG. 2 will now be described.

Within the scope of this invention, assume the case of a digital data transmission system in which the phase value of the signal emitted at sampling times, represents the data. The receiver of the system should process the received signal to allow correct detection of the phase of the signal received at sampling times to fetch the data out. Processing the received signal which is not within the scope of the invention, generally includes, automatic control of the received signal amplitude to allow further processing of constant mean power signals, sampling of the signal received at times $t=nT$ and the conversion of the sampled signal in digital form. In addition, it includes, if necessary, the equalization of the received signal to reduce the effects of intersymbol interference. Detecting the value of the received signal phase, also sampled and equalized if necessary, at sampling times, is not within the scope of the invention either, and can, for instance, be ensured by the phase detector described in U.S. Pat. No. 3,825,737, filed Dec. 11, 1972 on behalf of Alain Crosier, which patent is assigned to the assignee of the present invention.

These phase values form the input signals of the device of this invention.

The signal applied to the input of the phase filter of the invention, shown on FIG. 2, appears, therefore, as a sequence of discrete phase values ($\phi'_n$), where $\phi'_n$ is the phase value of the signal received at sampling time $t=nT$.

Phase $\phi'_n$ can be expressed as follows $$\phi'_n = \phi_n + \epsilon_n \tag{6}$$

where $\phi_n$ is the discrete value of the phase of the signal emitted at time $t=nT$, and represents the data, and $\epsilon_n$ represents all disturbances or noises introduced during the signal transmission.

In a Q phase system, Q being a positive integer, i.e., in a system in which the emitted signal phase can assume Q distinct discrete values at each sampling time, $\phi_n$ can take the following values $$\phi_n = 0, \frac{2\pi}{Q}, \frac{4\pi}{Q}, \ldots, \frac{2(Q-1)\pi}{Q} \tag{7}$$

Noise $\epsilon_n$ can be expressed as follows $$\epsilon_n = \frac{2\pi}{Q}(a_0 + a_1 n + x_n) \tag{8}$$

where $a_o$ is a constant representing phase intercept $a_1$ is a constant representing the frequency shift between two successive sampling times, and $x_n$ is a random noise component representing phase jitter and white noise.

Phase $\phi'_n$ is applied via line 1, to an input of multiplier 2 which multiplies it by factor $Q/2\pi$ stored in storage element 4. Multiplier 2 provides at its output, on line 5, signal $y_n$.

$$y_n = \frac{Q}{2\pi}\phi'_n \tag{9}$$

Substituting $\phi'_n$ by its value obtained for expression (6), into expression (9)

$$y_n = \frac{Q}{2\pi}(\phi_n + \epsilon_n) \tag{10}$$

which can be expressed as follows $$y_n = l_n + b_n \tag{11}$$

with $$l_n = \frac{Q}{2\pi}\phi_n$$

and $$b_n = \frac{Q}{2\pi}\epsilon_n$$

From (7) and (8), one has, respectively $$l_n = 0, 1, 2, \ldots, (Q-1) \tag{12}$$

$$b_n = a_0 + a_1 n + x_n \tag{13}$$

It is to be noted that $l_n$ is an integer representing the data and that $b_n$ represents all the noise components introduced during the transmission. It is to be noted that the very particular purpose of the multiplication of value $\phi'_n$ by factor $Q/2\pi$ is to apply to the input of first decision filter 6, a signal $y_n$ equal to an integer in the absence of noise, which appears in equations (11) and (13) by making $b_n=0$.

The object of the system of this invention is to retrieve $l_n$ and to minimize the effects of $b_n$. According to this invention, the reduction of the effects of $b_n$ to a minimum is obtained by cancelling phase intercept $a_o$ and phase shift $a_1 n$ introduced by frequency shift $a_1$, by using first decision filter 6 and by reducing random component $x_n$ by using second decision filter 8.

The operation of first decision filter 6 will now by analyzed.

Signal $y_n$ available on line 5 is applied to the (+) input of subtractor 10 which receives at its (−) input an error signal $u_n$ supplied by linear filter 12 the transfer function of which is referenced W(z). Subtractor 10 supplies at its output, difference $y_n-u_n$ which is applied to the input of detector-separator 11.

The analysis of the system according to this invention will be carried out assuming that no detection errors appear, said errors being supposed to be very rare. From (11), we have $$y_n - u_n = l_n + b_n - u_n$$
$$y_n - u_n = l_n + f_n \qquad \text{with } f_n = b_n - u_n \tag{14}$$

Since $l_n$ is a positive integer, saying that there is no detection errors means that $f_n$ is a fractional number the absolute value of which is comprised between 0 and 1. The function of detector-separator 11 to be described in detail with reference to FIG. 11, consists in fetching $l_n$ and $f_n$ out of difference $y_n-u_n$ applied to it. In detector-separator 11, only output $E_r$ providing residual noise component $f_n$, is used and connected to line 14. Signal $f_n$ is applied to linear filter 12 with transfer function $W(z)$, the function of which consists in generating error signal $u_n$ from the sequence of residual noise components $\{f_n\}$.

It should be noted that when only first decision filter 6 is necessary, i.e., when the effects of the random component can be neglected, output Da of detector-separator 11 providing $l_n$ as an output of the phase filter, will be used.

Now, transfer function $W(z)$ will be determined so that first decision filter 6 cancels phase intercept $a_0$ and phase shift $a_1 n$ introduced by the frequency shift. For that, it is always assumed that there is no detection errors and the response of decision filter 6 will be analyzed with respect to noise $b_n$ only. In this case, decision filter 6 can be as shown on FIG. 3. It should be noted that in the filter shown on the figure, detector-separator 11 is cancelled since it has no effect on residual noise component $f_n$ when there is no detection errors. On the other hand, random component $x_n$ in noise $b_n$ will be neglected, which will be verified later.

Therefore, it is assumed that:

$$b_n = a_0 + a_1 n$$
$$n = 0, 1, 2, \ldots \quad (15)$$

Determining $W(z)$ so that first decision filter 6 cancels $a_0$ and $a_1 n$, i.e., cancels $b_n$ as defined by (15), means determining $W(z)$ so that $f_n = 0$ when $b_n = a_0 + a_1 n$.

Assume that $B(z)$ and $F(z)$ are the Z-transforms of $b_n$ and $f_n$, respectively, from (3)

$$B(z) = \sum_{k=0}^{+\infty} b_k z^{-k} \quad (16)$$

$$F(z) = \sum_{k=0}^{+\infty} f_k z^{-k} \quad (17)$$

Figure 3:
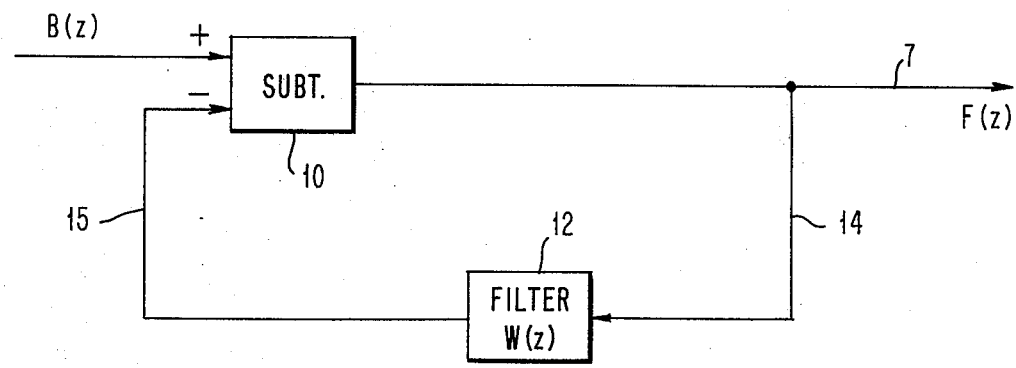
FIG. 3 is a diagram making the analysis of the first decision filter operation, easier.

From FIG. 3, we have $$F(z) = B(z) - W(z) F(z)$$

or $$F(z) = \frac{1}{1 + W(z)} B(z)$$

or $$F(z) = G(z) B(z) \quad (18)$$

with $$G(z) = \frac{1}{1 + W(z)} \quad (19)$$

It should be noted that $G(z)$ represents the transfer function of first decision filter 6.

From (16) and (15)

$$B(z) = \sum_{k=0}^{+\infty} b_k z^{-k} = \sum_{k=0}^{+\infty} (a_0 + a_1 k) z^{-k}$$

$$= \sum_{k=0}^{+\infty} a_0 z^{-k} + \sum_{k=0}^{+\infty} a_1 k z^{-k} \quad (20)$$

From (5)

$$\sum_{k=0}^{+\infty} a_0 z^{-k} = \frac{a_0}{1-z^{-1}} \quad (21)$$

Furthermore $$\sum_{k=0}^{+\infty} a_1 k z^{-k} = a_1 [z^{-1} + 2z^{-2} + 3z^{-3} + \ldots ] \quad (22)$$

Relation (5) can be expressed as follows $$1 + z^{-1} + z^{-2} + \ldots = \frac{1}{1-z^{-1}} \quad (23)$$

The derivative from (23) with respect to $z$ can be expressed as follows:

$$-z^{-2} - 2z^{-3} - 3z^{-4}, \ldots = \frac{-z^{-2}}{(1-z^{-1})^2} \quad (24)$$

Relation (24) can be written $$z^{-1} + 2z^{-2} + 3z^{-3} + \ldots = \frac{z^{-1}}{(1-z^{-1})^2} \quad (25)$$

Substituting (25) into (22)

$$\sum_{k=0}^{\infty} a_1 k z^{-k} = \frac{a_1 z^{-1}}{(1-z^{-1})^2} \quad (26)$$

Substituting (21) and (26) into (20)

$$B(z) = \frac{a_0 + (a_1 - a_0) z^{-1}}{(1-z^{-1})^2} \quad (27)$$

Now, it will be shown that a filter the transfer function of which is as follows $$G(z) = \frac{(1-z^{-1})^2}{(1-\alpha z^{-1})^2} \text{ with } 0 < \alpha < 1 \quad (28)$$

cancel a noise $B(z)$ as defined by (27)

In effect, by substituting the values of $B(z)$ and $G(z)$ given in expressions (27) and (28), respectively, into (18), we have the following expression of $F(z)$ $$F(z) = \frac{a_0 + (a_1 - a_0) z^{-1}}{(1-\alpha z^{-1})^2} \quad (29)$$

corresponding sequence $\{f_n\}$ of which will now be determined. Expression (29) can be expressed as follows $$F(z) = \frac{a_0}{(1-\alpha z^{-1})^2} + \frac{(a_1 - a_0) z^{-1}}{(1-\alpha z^{-1})^2} \quad (30)$$

From (25)

$$\frac{a_o}{(1-\alpha z^{-1})^2} = a_o [1+2\alpha z^{-1} + 3\alpha^2 z^{-2} + \cdots + (k+1)\alpha^k z^{-k} + \ldots]$$

$$= \sum_{k=0}^{+\infty} a_o(k+1) \alpha^k z^{-k} \quad (31)$$

and $$\frac{(a_1-a_o) z^{-1}}{(1-\alpha z^{-1})^2} = (a_1-a_o) z^{-1} [1+2\alpha z^{-1} + 3\alpha^2 z^{-2} + 4\alpha^3 z^{-3} + \ldots]$$

$$= (a_1-a_o) [z^{-1} + 2\alpha z^{-2} + 3\alpha^2 z^{-3} + \ldots + k\alpha^{k-1} z^{-k} \ldots]$$

$$= \sum_{n=0}^{\infty} (a_1-a_o) k\alpha^{k-1} z^{-k} \quad (32)$$

Substituting (31) and (32) into (30)

$$F(z) = \sum_{k=0}^{\infty} [a_o(k+1)\alpha^k + (a_1-a_o)k\alpha^{k-1}] z^{-k} \quad (33)$$

From the Z-transform definition recalled in (3), we have $$f_n = a_o(n+1)\alpha^n + (a_1-a_o)n\alpha^{n-1}$$

or $$f_n = \alpha^n [a_o + \frac{a_1-a_o(1-\alpha)}{\alpha} n] \quad (34)$$

Since $0 < \alpha < 1$, it is seen from expression (34), that $f_n \to 0$ when $n \to \infty$. In other words, decision filter 6 with transfer function $G(z)$ as defined by (28), cancels phase intercept $a_0$ and phase shift $a_1 n$ when $n \to \infty$, i.e., in steady condition.

It is to be noted, from expression (28), that $G(z) \to 1$ when $\alpha \to 1$, i.e., that the effect of the first decision filter on the components other than $a_0$ and $a_1 n$, and in particular on random component $x_n$, can be neglected when $\alpha \to 1$, which verifies the original assumption according to which $x_n$ was neglected in the analysis of first decision filter 6.

However, when $\alpha \to 1$, the time response of the filter becomes infinite. Therefore, it is necessary to choose $\alpha$ so that decision filter 6 cancels components $a_0$ and $a_1 n$ and does not have appreciable effect on component $x_n$ while having a correct response time. A good compromise is obtained, for example, with $\alpha=0.9$.

Transfer function $G(z)$ of first decision filter 6 being determined by expression (28), transfer function $W(z)$ of linear filter 12 is obtained by calculating $W(z)$ in function of $G(z)$ from (19) and by replacing $G(z)$ by its value derived from (28). We have $$W(z) = \frac{1-G(z)}{G(z)}$$

and $$W(z) = \frac{2(1-\alpha)z^{-1} + (\alpha^2-1)z^{-2}}{1-2z^{-1}+z^{-2}} \quad (35)$$

Figure 4:
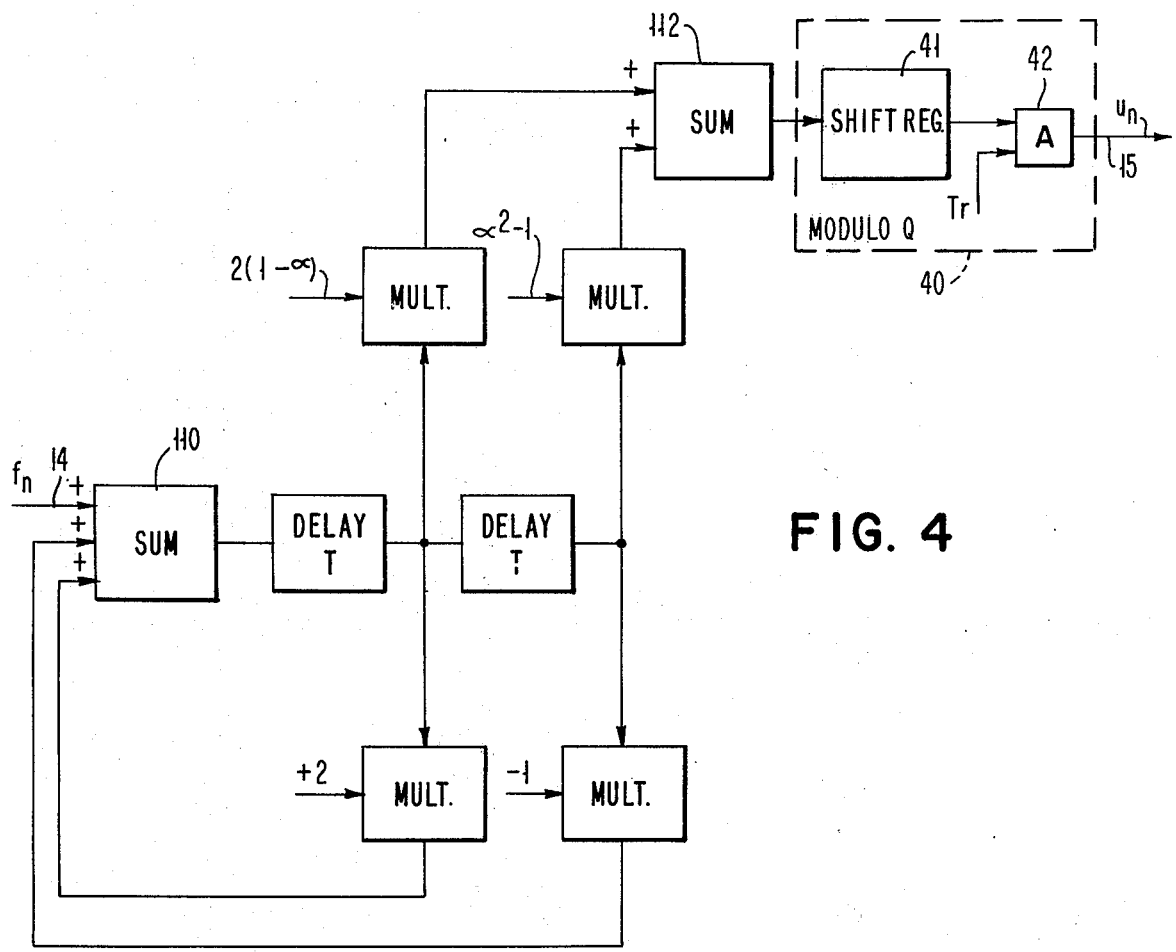
FIG. 4 schematically shows as an example, a digital embodiment of linear filter W(z), 12, of FIG. 2.

FIG. 4 schematically shows an example of a digital embodiment of a digital linear filter 12 in canonical form with transfer function $W(z)$ as defined by relation (35). The embodiment of a digital filter from its transfer function, is a technique known in the art and a description of which can be found, for example, in the article entitled: "Digital Filter Design Techniques in the Frequency Domain" by C. M. Rader and B. Gold, published in the "Proceedings of the IEEE", Vol. 55, No. 2, February 1967, pages 149 to 171. In FIG. 4, lines 14 and 15 have the same references as in FIG. 2.

The filter shown on the figure conventionally includes two binary summing devices 110 and 112, two delay elements each shown as a block T, each one introducing an elementary delay T, and four binary multiplying devices multiplying the signals delivered from the outputs of the delay elements by factors $+2$, $-1$, $2(1-\alpha)$, and $(\alpha^2-1)$ respectively, said factors appearing in expression (35) of transfer function $W(z)$. In the embodiment shown on the figure, the output of summing device 112 is connected to the input of a modulo Q logic unit 40 the output of which is connected to line 15.

The use of a modulo Q logic unit is made necessary by the type of the signals processed in the system of the invention. In effect, input signal $\phi'_n$ applied to line 1 represents a phase value lying within the range 0 $-2\pi$ radians. Then, this phase value is multiplied by factor $Q/2\pi$ by multiplying device 2, therefore, result $y_n$ of this multiplication is a value lying within the range 0 – Q. As seen above, $Y_n$ is applied to the (+) input of subtractor 10 the (−) input of which receives error signal $u_n$. To avoid saturation of the system, it is therefore necessary for signal $u_n$ to be also comprised between 0 and Q, i.e., for the output signal of filter 12 to be included between 0 and Q, which involves the use of a modulo Q logic unit at the output of this filter.

By referring again to FIG. 4, it can be seen that the modulo Q logic unit is, in fact, very simple when operating on binary numbers. In effect, it is known that the binary representation of a number by m bits is a modulo $2^m$ representation of this number and that the representations of $x$ and $x+p2^m$ ($p$ is an integer) are identical for the $m$ low-order bits. The representation of the negative numbers is obtained by using the 2's complement, i.e., by adding the negative value of $x$ to $2^m$. It is to be noted that, as in the case of the binary representation with a sign bit, the highest order bit is 0 for $x \geq 0$ and 1 for $x < 0$.

In the embodiment shown on FIG. 4, Q is coded with 8 bits and then, the modulo Q logic unit is a binary modulo $2^8$ logic unit. Inside the filter itself, the use of 16 bit binary numbers has been chosen to have a better accuracy in the calculations, thus the outputs of summing devices 110 and 112 are 16 bit numbers. The operation consisting of taking only the modulo $2^8$ value of the filter output signal, i.e., of the summing device 112 output signal, is simply ensured by taking only the 8 low-order bits of the signal provided by summing device 112. Logic unit 40 is limited to a shift register 41 of 16 bits the input of which is connected to the output of summing device 112 and to a two input AND gate 42. The output of register 41 is connected to an input of AND gate 42 which is rendered conductive only for the 8 low-order bits, i.e., the first 8 bits of the number stored in register 41. AND gate 42 is conditioned by a gate control signal Tr applied to the second input of AND gate 42. AND gate 42 delivers at its output, modulo $2^8$ error signal $u_n$ which is applied to the (−) input of subtractor 11 through line 15 (FIG. 2).

The operation of second decision filter 8 will be analysed in the next paragraph.

It is assumed that transfer function W(z) of filter 12 is chosen as determined by expression (35) so that the noise component at the input of second decision filter 8 has essentially the same characteristics as the ones of noise $b_n$ applied to the input of first decision filter 6, except that components $a_0$ and $a_1 n$ are supposed to be removed by decision filter 6. With reference to expression (13), it is seen that the noise at the input of second decision filter 8 includes, then, only random component $x_n$. The signal applied to the input of decision filter 8 is, therefore, the sum of signal $1_n$ representing the data, the value of which is not affected by the first decision filter (when there is no detection error) and of random noise component $x_n$. Signal $1_n + x_n$ is applied via line 7 to the (+) input of subtractor 16 which receives, at its (−) input, an error signal which is, in fact, an estimated value of $x_n$, referenced $\hat{x}_n$. The output signal of subtractor 16 can be written $1_n + e_n$, where $e_n$ represents the difference between $x_n$ and $\hat{x}_n$, i.e., the residual random component. Signal $1_n + e_n$ is applied to the input of detector-separator 18 identical to detector-separator 12, except that only the output delivering signal $1_n$ representing the detected data, is used. Signal $1_n$ detected by detector-separator 18 is applied via line 22, to the input of elementary delay element 20 with transfer function $z^{-1}$ and providing signal $1_{n-1}$ at its output. Signal $1_{n-1}$ is applied to the (−) input of subtractor 17 the (+) input of which receives signal $1_n + x_n$ delayed by elementary delay element 21, i.e., signal $1_{n-1} + x_{n-1}$. The output signal of subtractor 17 representing random component $x_{n-1}$ when there is no detection error, is applied to the input of predictive filter 19 with transfer function P(z), via line 25. The function of predictive filter 19 the output of which is connected to the (−) input of subtractor 16, consists in predicting the estimated value of $x_n$, $\hat{x}_n$, from the prior values of the random component, to minimize residual random component $e_n$ at the input of detector-separator 18.

Predictive filter 19 with transfer function P(z) will be now determined so that second decision filter 8 minimizes random component $x_n$. For this purpose, it will be successively assumed that the spectrum of random component $x_n$ is known, then that it is undetermined or time-varying.

First assumption: The shape of the spectrum of $x_n$ is known.

It is assumed that sequence $\{x_n\}$ has a known rational spectrum. The power spectral density $R_x(z)$ of $x_n$ can be expressed as follows:

$$R_x(z) = \frac{N(z) N(z^{-1})}{D(z) D(z^{-1})} \quad (36)$$

where N(z) and D(z) are z-polynomials all of whose zeroes lie outside the unit circle, and $N(z^{-1})$ and $D(z^{-1})$ are the conjugated polynomials of N(z) and D(z) respectively, readily obtained by replacing z by $z^{-1}$. It can be shown that any finite energy rational noise spectrum can be transferred into this form by applying the "spectral factorization" method. It can be shown that optimal predictive filter P(z) of $x_n$, in the mean square sense, i.e., predictive filter P(z) which minimizes $\overline{e_n^2}$, is $$P(z) = z \; \frac{|N(z^{-1}) - aD(z^{-1})|}{N(z^{-1})} \quad (37)$$

where $$a = N(0)/D(0).$$

Now, it is possible to determine the whole transfer function of second decision filter 8. For this purpose, it is always assumed that there is no error detection and only the noise components are considered. By referring to FIG. 2 and using the Z-transform.

$$E(z) = (1 - z^{-1} P(z)) X(z) \quad (38)$$

where

E(z) and X(z) are the Z-transforms of $e_n$ and $x_n$, respectively.

Expression (38) can be expressed as follows $$E(z) = H(z) X(z) \quad (39)$$

with $$H(z) = 1 - z^{-1} P(z) \quad (40)$$

where

H(z) is the transfer function of second decision filter 8.

By substituting the value of P(z) derived from expression (37) into expression (40), one obtains transfer function H(z) of second decision filter 8 which reduces random component $x_n$ in the assumption under consideration. We have $$H(z) = \frac{aD(z^{-1})}{N(z^{-1})} \quad (41)$$

$$R_e(z) = |H(z)|^2 R_x(z) = H(z) H(z^{-1}) R_x(z) \quad (41')$$

From (36) and (41)

$$R_e(z) = a^2 \quad (42)$$

This expression shows that the optimum filter is the one which produces a white noise spectrum at the input of detector-separator 18. On the other hand, $a^2$ represents total noise power $\overline{e_n^2}$.

EXAMPLES

Let the power spectral density $R_x(z)$ of sequence $\{x_n\}$ be of the form $$R(z) = \frac{1}{k_1 + k_2 + k_3} \left\{ k_1 \left[ \frac{P_1}{g_1(z) g_1(z^{-1})} \right] + k_2 \left[ \frac{P_2}{g_2(z) g_2(z^{-1})} \right] + k_3 \right\} \quad (43)$$

where
$P_i = 2(2\pi f_i T)^2 (1-\mu_i^2)$
$g_i(z) = 1 - 2\mu_i \cos(2\pi f_i T)z + \mu_i^2 z^2$
$T$ = sampling period $\overline{x_n^2} \simeq 1$ The two terms in brackets in expression (43) represent the noise components concentrated in frequency bandwidths proportional to $(1-\mu_i)$ and centered at $f_i Hz$, and term $k_3$ represents white noise.

EXAMPLE 1

Let $k_1=4$, $k_2=k_3=1$ $T = 1800Hz$, $f_1=55Hz$, $f_2=110Hz$ and $\mu_1=\mu_2=0.85$.

Figure 5:
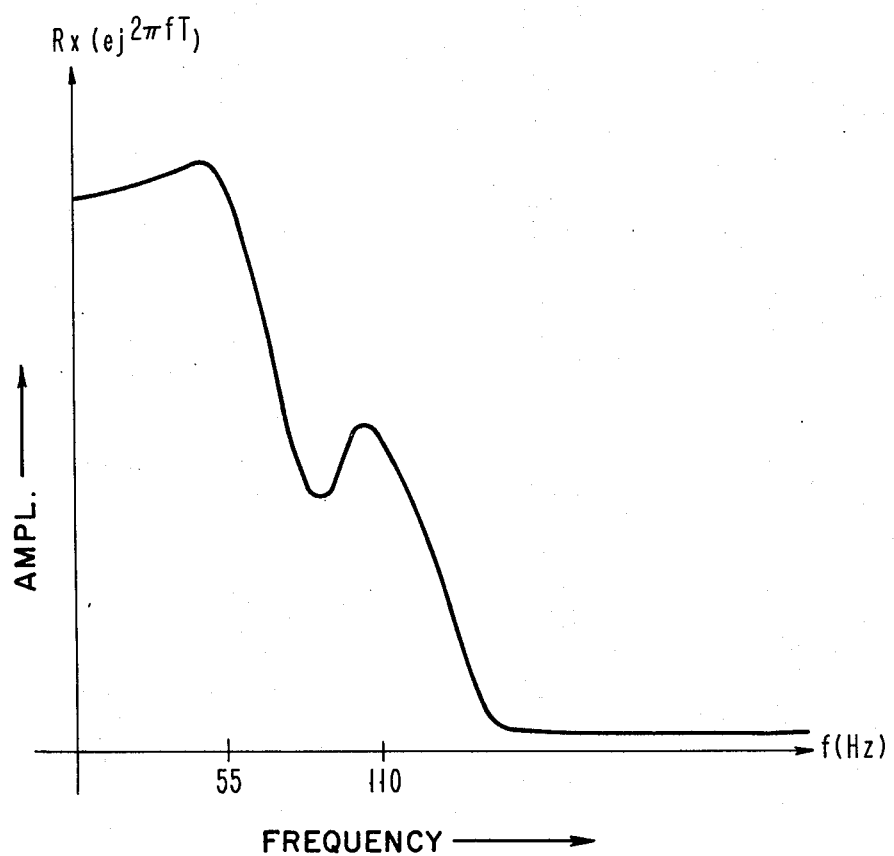
FIG. 5 shows the shape of spectrum $R_x(e^{j2\pi fT})$ of random component $x_n$ in example 1 of second decision filter 8.

Spectrum $R_x(e^{j2\pi ft})$ corresponding to this example is shown on FIG. 5.

combining terms in expression (43), we obtain a rational expression that factors into the form (36) where $N(z) = 0.63(1-1.34z+0.56z^2)(1-1.13z+0.4z^2)$ $D(z) = (1-1.67z+0.7225z^2)(1-1.58z+0.7225z^2)$ $a^2 = 0.39$ We obtain transfer function $P(z)$ $$P(z) = \frac{0.81 - 1.61z^{-1} + 1.18z^{-2} - 0.278z^{-3}}{N(z^{-1})}$$

EXAMPLE 2

Repeating the above example with $k_3=\frac{1}{4}$ gives $N(z) = 0.4(1-1.46z+0.61z^2)(1-0.78z+0.25z^2)$ $D(z)$, same as example 1

$a^2 = 0.163$

It should be noted that in example 2, $a^2$ is much smaller than in example 1, indicating that the filter is more effective when the white noise component is small compared with the other components.

The embodiment of digital predictive filter 19 will not be described here since it can be conventionally obtained from the expression of P(z), as described, for example, in the above-mentioned article by C. M. Rader and B. Gold.

Figure 6:
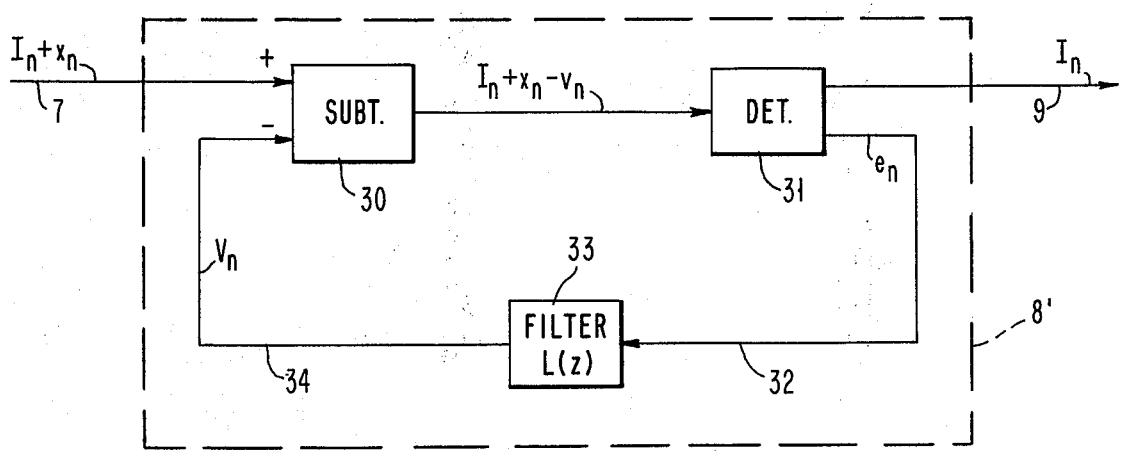
FIG. 6 schematically shows another possible embodiment of second decision filter 8 of FIG. 2.

It should be noted that the configuration of decision filter 8 as shown in FIG. 2, can be modified to obtain a configuration identical to the one of the first decision filter shown in FIG. 2. FIG. 6 shows a possible configuration of second decision filter 8, designated 8'. In this configuration, line 7 is connected to the (+) input of a binary subtractor 30 the output of which is connected to the input of a detector-separator 31 identical to detector-separators 11 and 18. A first output of the detector-separator is connected to data output line 9 while a second output is connected via line 32 to the input of a digital linear filter 33 the transfer function of which is referenced L(z). The output of filter 33 is connected to the (−) input of subtractor 30 via line 34. In operation, signal $1_n+x_n$ is applied via line 7, to the (+) input of subtractor 30 the (−) input of which receives an error signal $v_n$ provided by filter 33. The subtractor provides at its output, signal $1_n+e_n$ where $e_n=x_n-v_n$ is the residual random component at the input of detector-separator 31. As indicated above, the function of the detector consists in detecting $1_n$ and $e_n$. When there is no detection error, $1_n$ is provided on line 9 while residual random component $e_n$ is supplied by the second output of detector-separator 31 connected to line 32. The function of filter 33 consists in generating error signal $v_n$ from the prior values of residual random component $e_n$.

It will now be shown that the configurations of second decision filters 8 and 8' as they appear in FIGS. 2 and 6, respectively, are equivalent and l(z) will be determined so that the configuration of FIG. 6 reduces random component $x_n$ to a minimum. It will be always assumed that there is no detection error and only the noise components will be considered. By referring to FIG. 6 and using the Z-transform, we have:

$$E(z) = X(z) - L(z) E(z) \qquad (44)$$

or $$E(z) = \frac{1}{1+L(z)} X(z) \qquad (45)$$

where $E(z)$ and $X(z)$ are the Z-transforms of $e_n$ and $x_n$, respectively.

Expression (45) can be expressed as follows $$E(z) = H'(z) X(z) \qquad (46)$$

with $$H'(z) = \frac{1}{1+L(z)} \qquad (47)$$

where $H'(z)$ is the transfer function of the configuration of the filter shown on FIG. 6.

In order to have the two configurations of second decision filters 8 and 8' as they appear on FIGS. 2 and 6, respectively, equivalent, it is necessary for said two configurations to have the same transfer function, i.e., $$H'(z) = H(z) \qquad (48)$$

or from (40) and (47)

$$1-z^{-1} P(z) = \frac{1}{1+L(z)} \qquad (49)$$

From which, it can be deduced that we must have $$P(z) = z \frac{L(z)}{1+L(z)} \qquad (50)$$

or $$L(z) = z^{-1} \frac{P(z)}{1-z^{-1}P(z)} \qquad (51)$$

Figure 8:
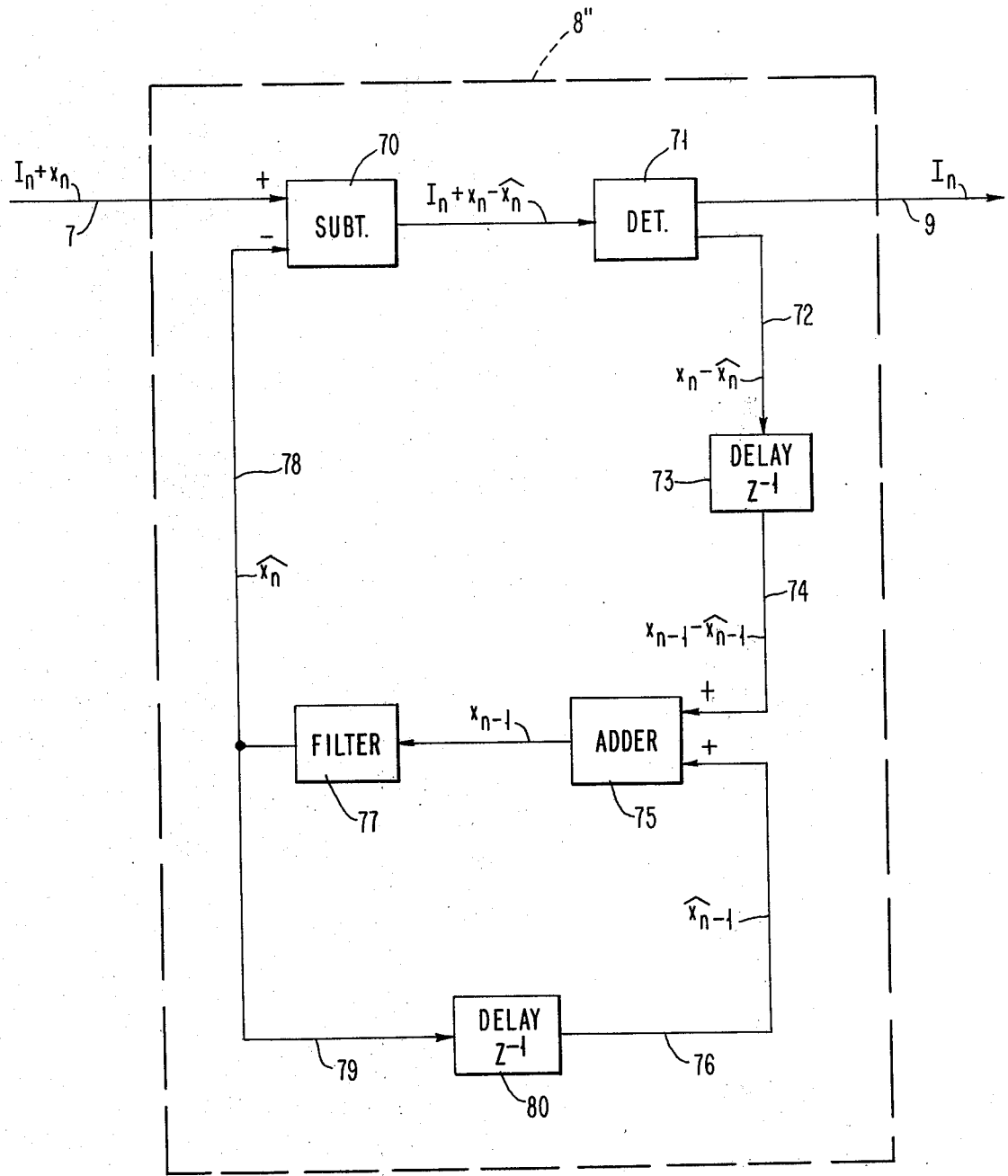
FIG. 8 shows another possible embodiment of second decision filter 8, including an adaptive predictive filter.

The value of $L(z)$ so that the second configuration of second decision filter 8 shown in FIG. 8, cancels random component $x_n$, is readily obtained by replacing $P(z)$ in (54) by its value derived from (37). It yields:

$$L(z) = \frac{N(z^{-1}) - aD(z^{-1})}{aD(z^{-1})} \qquad (52)$$

Reconsidering example 1

$$L(z) = \frac{1.24z^{-1} - 2.55z^{-2} + 1.87z^{-3} - 0.4z^{-4}}{D(z^{-1})} \qquad (52')$$

So far, one has determined the two possible configurations of second decision filter 8, when the shape of the spectrum of random component $x_n$ is known. The second assumption will now be studied.

Second Assumption: The $x_n$ spectrum shape is undetermined or time-varying.

It was seen above that random component $x_n$ is mainly due to phase jitter and white noise. Now, we will consider the case when the phase jitter effect is preponderant over the white noise effect and random component $x_n$ will be considered as phase jitter.

Since phase jitter is generally provided with a spectrum limited between 0 and 300 Hz while the sampling frequency, i.e., the character transmission rate in a digital data transmission system is very often at least equal to 1200 Hz, it is possible to obtain a good estimated value of $x_n$ by using an adaptive predictive filter, for instance a Wiener adaptive predictive filter. It will be briefly recalled below what is a Wiener adaptive predictive filter of order $p$.

Assume that $s_{n-1}$ is the $(n-1)^{th}$ sample of a low frequency signal, and that $\hat{s}_n$ is an estimated value of the next sample. Estimated value $\hat{s}_n$ is obtained by carrying out an extrapolation on the last $p$ samples. This can be expressed as follows $$\left.\begin{array}{l}\hat{s}_{p+1} = \alpha_1 s_1 + \alpha_2 s_2 + \ldots + \alpha_p s_p \\ \hat{s}_{p+2} = \alpha_2 s_2 + \ldots + \alpha_p s_{p+1} \\ \vdots \\ \hat{s}_n = \alpha_1 s_{n-p} + \alpha_2 s_{n-p+1} + \ldots + \alpha_p s_{n-1}\end{array}\right\} \qquad (53)$$

with $n \geq 2p$.

Factors $\alpha_i$, $i=1,2,\ldots,p$ are adjusted so that error $E_{n-1}$, in the means square sense, between the actual value of $s_q$ and its estimated value $\hat{s}_q$, $q=p$, $(p+1)$, is at a minimum:

$$E_{n-1} = \sum_{q=p+1}^{n-1} (s_q - \hat{s}_q)^2 \qquad (54)$$

In this assumption, it is possible to replace predictive filter 19 of second decision filter 8 shown in FIG. 2, by a Wiener adaptive predictive filter. If a Wiener filter of order $p=5$, for instance, is used, estimated value $\hat{x}_n$ of $x_n$ is obtained from the following iteration relation $$\hat{x}_n = \alpha_1 x_{n-1} + \alpha_2 x_{n-2} + \alpha_3 x_{n-3} + \alpha_4 x_{n-4} + \alpha_5 x_{n-5} \qquad (55)$$

The values of $\alpha_i$, $i=1,\ldots,5$, are calculated so that error $E_{n-1}$ in the mean square sense, between $x_q$ and $\hat{x}_q$, $q=6,\ldots,(n-1)$ is at a minimum. We have $$E_{n-1} = \sum_{q=6}^{n-1} (x_q - \hat{x}_q)^2 \qquad (56)$$

Figure 7:
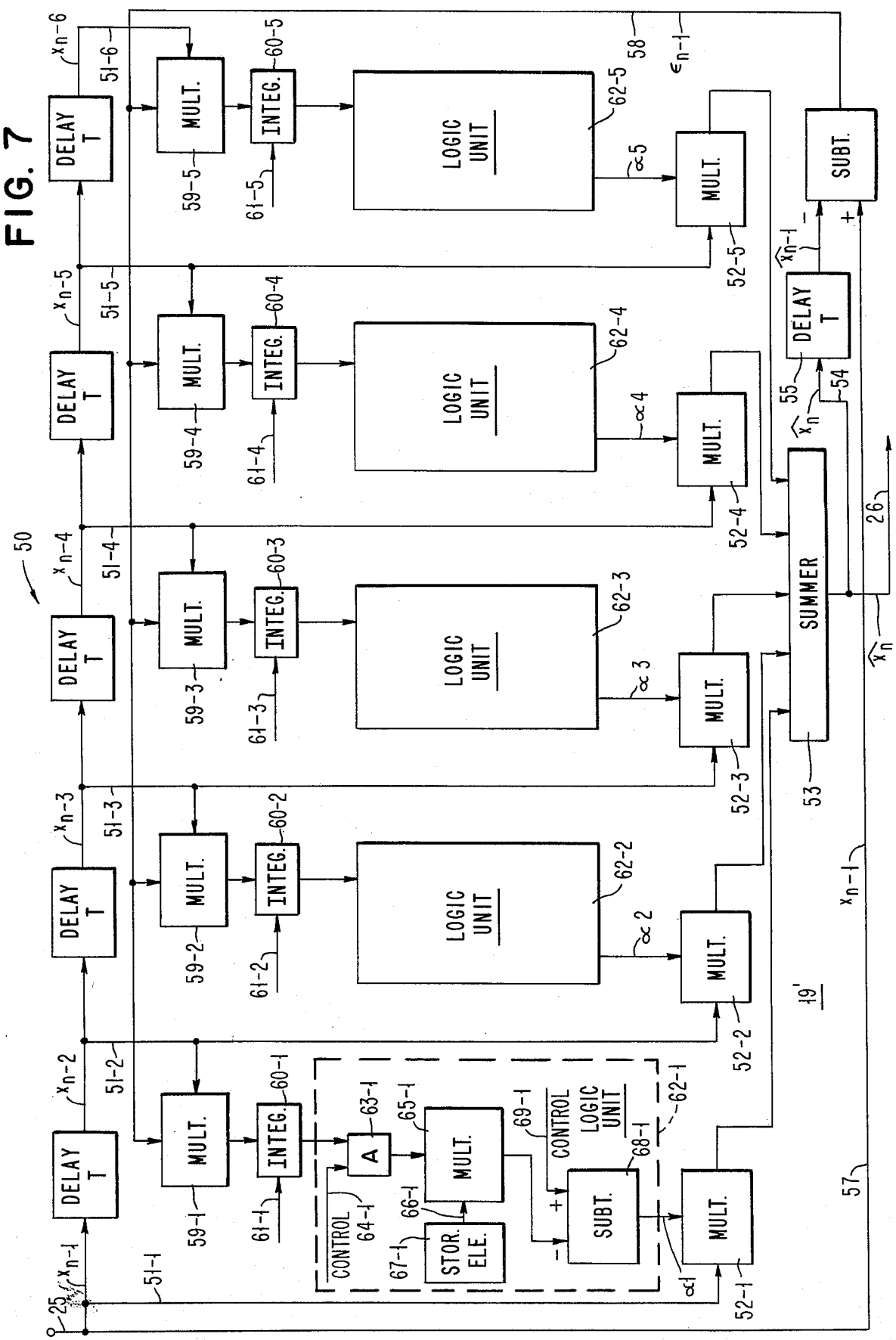
FIG. 7 schematically shows as an example, an embodiment of a Wiener adaptive optimal predictive digital filter which can be used in second decision filter 8.

FIG. 7 schematically shows an example of a digital embodiment of such a Wiener adaptive predictive filter 19'.

Signal $x_{n-1}$ provided from the output of subtractor 17 (FIG. 2) is applied to the input of a 5T long delay line 50, T being the sampling period via line 25. In a digital embodiment, this delay line consists in a shift register including five stages, each one introducing a delay T. This delay line includes six taps 51-1, 51-2, ..., 51-6 positioned with respect to T so that when value $x_{n-1}$ is applied to the input of delay line 50, and therefore, is available at tap 51-1, values $x_{n-2}, x_{n-3}, x_{n-4}, x_{n-5}$ and $x_{n-6}$, respectively, are available at taps 51-2, ..., 51-6.

Taps 51-1, ..., 51-5 are respectively connected to a first input of five binary multipliers 52-1, ..., 52-5. The output of these multipliers are connected to the inputs of a summing device 53 the output of which supplies estimated value $\hat{x}_n$ on line 26. The output of summing device 53 is further connected via line 54, to the input of a delay element 55 introducing a delay T, the output of said delay element thus supplying value $\hat{x}_{n-1}$. The output of delay element 55 is connected to the (−) input of a binary subtractor 56, the (+) input of which is connected to line 25 via line 57. The output of subtractor 56 providing error signal $\epsilon_{n-1} = x_{n-1} - \hat{x}_{n-1}$, is connected via line 58, to a first input of five binary multipliers 59-1, 59-2, ..., 59-5, the second inputs of which are respectively connected to taps 51-2, ..., 51-6. The outputs of multipliers 59-1, ..., 59-5 are respectively connected to the input of five digital integrators 60-1, 60-2, ..., 60-5 which, in the embodiment shown on the figure, consist in reversible counters. Each of integrators 60-1, ..., 60-5 is provided with a resetting input, respectively connected to lines 61-1, ..., 61-5. The outputs of integrators 60-1, ..., 60-5 are respectively connected to the input of five factor adjusting logic units 62-1, 62-2, ..., 62-5, the outputs of which are respectively connected to the second input of each of multipliers 52-1, ..., 52-5. The outputs of logic units 62-1, ..., 62-5, respectively supply the values of factors $\alpha_1, \alpha_2, \ldots \alpha_5$. To simplify the drawing, only logic unit 62-1 is shown in detail, other logic units 62-2, ..., 62-5 being identical to the first one. Logic unit 62-1 includes a two input AND gate 63-1 with two inputs, one of which is connected to the output of integrator 60-1 and the second one is connected to a first control signal source (not shown), via line 64-1. The output of AND gate 63-1 is connected to a first input of a binary multiplier 65-1 the second input of which is connected to a storage element 67-1 via line 66-1. The output of multiplier 65-1 is connected to the (−) input of a binary subtractor 68-1 the (+) input of which is connected to a second control signal source (now shown) via line 69-1. The output of subtractor 68-1 is connected to the second input of multiplier 52-1.

The device shown on FIG. 7 will now be described.

The device shown on the figure should provide estimated value $\hat{x}_n$ obtained from expression (55), factors $\alpha_i$, $i=1, \ldots, 5$ being obtained by minimizing error $E_{n-1}$ defined by expression (56) recalled below.

$$E_{n-1} = \sum_{q=6}^{n-1} (x_q - \hat{x}_q)^2 \qquad (57)$$

$$E_n{}_{-1} = \sum_{q=6}^{n-1} \epsilon_q{}^2 \qquad (58)$$

with $$\epsilon_q = x_q - \hat{x}_q \qquad (59)$$

Error $E_{n-1}$ appearing as a square sum $\epsilon_q{}^2$, $q=6$, $(n-1)$, minimizing $E_{n-1}$ is the same as minimizing all $\epsilon_q{}^2$, $q=6$, ..., $(n-1)$ successively and summing the minimum values of $\epsilon_q{}^2$ obtained in this way. One will consider the instant where signal $x_{n-1}$ is applied to the input of the Wiener predictive filter and analyse the minimization of $\epsilon_{n-1}{}^2$, while showing how the device shown on the figure takes the minimum values of the prior $\epsilon_q{}^2$ into account.

Since the only adjustable elements which can be modified to minimize $\epsilon_{n-1}{}^2$ are the values of coefficients $\alpha_i$, $i=1, 2, \ldots, 5$, elementary error $\epsilon_{n-1}{}^2$ will be minimum if the derivative of $\epsilon_{n-1}{}^2$ with respect to the various coefficients, is cancelled, i.e., if $$\frac{\delta \epsilon^2{}_{n-1}}{\delta \alpha_i} = 0 \text{ for } i = 1, \ldots, 5 \qquad (60)$$

we have $$\delta \epsilon^2{}_{n-1} = 2\epsilon_{n-1} \frac{\delta \epsilon_{n-1}}{\delta \alpha_i} \qquad (61)$$

Substituting $\epsilon_{n-1}$ by its value derived from (59)

$$\delta \epsilon^2{}_{n-1} = 2(x_{n-1} - \hat{x}_{n-1}) \frac{\delta (x_{n-1} - \hat{x}_{n-1})}{\delta \alpha_i} \qquad (62)$$

Signal $x_{n-1}$ being independent from the values of coefficients $\alpha_i$, expression (61) becomes $$\frac{\delta \epsilon^2{}_{n-1}}{\delta \alpha_i} = -2(x_{n-1} - \hat{x}_{n-1}) \frac{\delta \hat{x}_{n-1}}{\delta \alpha_i} \qquad (63)$$

but, from (55)

$$\hat{x}_{n-1} = \alpha_1 x_{n-2} + \alpha_2 x_{n-3} + \alpha_3 x_{n-4} + \alpha_4 x_{n-5} + \alpha_5 x_{n-6} \qquad (64)$$

or $$\hat{x}_{n-1} = \sum_{i=1}^{5} \alpha_i x_{n-1-i} \qquad (65)$$

Derivating expression (65) with respect to $\alpha_i$ $$\frac{\delta \hat{x}_{n-1}}{\delta \alpha_i} = x_{n-1-i} \text{ for } i = 1, \ldots, 5 \qquad (66)$$

Then, expression (63) becomes $$\frac{\delta \epsilon^2{}_{n-1}}{\delta \alpha_i} = -2(x_{n-1} - \hat{x}_{n-1}) x_{n-1-i} \text{ for } i = 1, \ldots, 5 \qquad (67)$$

Therefore, $\epsilon_{n-1}{}^2$ is minimized by making $$(x_{n-1} - \hat{x}_{n-1}) x_{n-1-i} = 0 \text{ for } i = 1, \ldots, 5 \qquad (68)$$

With reference to FIG. 7, it will be shown that the device of said figure, applies relation (68).

For clarity, only the adjustment of the value of coefficient $\alpha_1$, i.e., the application of expression (68) for $i=1$, will be described, the adjustment of the other coefficients being similar. Signal $x_{n-2}$ available on tap 51-2 is applied to the second input of multiplier 59-1 the first input of which receives signal $\epsilon_{n-1} = x_{n-1} - \hat{x}_{n-1}$ via line 58. Signal $\epsilon_{n-1}$ is provided by the output of subtractor 56 which receives, on its (+) input, signal $x_{n-1}$ via line 57, and on its (−) input, signal $\hat{x}_{n-1}$ available at the output of delay element 55. Therefore, the output of multiplier 59-1 provides product $(x_{n-1} - \hat{x}_{n-1}) x_{n-2}$ which is applied to the input of integrator 60-1 which accumulates the value of this product with the prior values of said product. A resetting line 61-1 is provided since, in practice, said products are accumulated only during a determined period of time, equal, in general, to the length of delay line 50. The result of this accumulation, which will be referenced $\Delta \alpha_1$, is used to adjust the value of $\alpha_1$ until this result is null. The result of the accumulation is applied to the input of the logic unit 62-1 provided for adjusting coefficients and supplying the new value of $\alpha_1$ at its output. In practice, this adjustment is not performed on each sampling time but, in general, after a determined period of time equal in general, to the length of delay line 50, and it is the reason why it has been provided, at the input of logic unit 62-1, and AND gate 63-1 which is rendered conductive only after this determined period of time has elapsed. Signal $\Delta \alpha_1$ is then applied to the first input of multiplier 65-1 which receives on its second input, a value $\mu$ stored in element 67-1 and representing the increment step of coefficients $\alpha_i$. The output of multiplier 65-1 providing product $\mu \Delta \alpha_1$ is connected to the (−) input of subtractor 68-1 to the (+) input of which is applied the prior value of $\alpha_1$.

$$\alpha_1{}_{new} = \alpha_1{}_{old} - \mu \Delta \alpha_1$$

which is applied to the second input of multiplier 52-1. Multiplier 52-1 multiplies the new value of $\alpha_1$ with signal $x_{n-1}$ available from tap 52-1. Then, multiplier 52-1 carries product $\alpha_1 x_{n-1}$ out, said product being applied to one of the inputs of summing device 53. Summing device 53 receives, on its other inputs, in the same way, products $\alpha_2 x_{n-2}, \alpha_3 x_{n-3}, \alpha_4 x_{n-4}, \alpha_5 x_{n-5}$, and supplies as an output, estimated value $\hat{x}_n$ defined by expression (55). Estimated value $\hat{x}_n$ is applied through line 54 to the input of delay element 55 which will apply it at the next sampling time, to the (−) input of subtractor 56. Then, value $\hat{x}_n$ will be used to carry on the coefficient adjusting procedure. This value $\hat{x}_n$ is further applied to the (−) input of subtractor 16 (FIG. 2) via line 26, for minimizing random component $x_n$ through second decision filter 8 (FIG. 2).

It should be noted that the adaptative predictor operates exactly as a conventional transversal equalizer, except that the error criterion is different. The above-described predictor cnverges exactly as an equalizer the taps of which are spaced by the sampling period. It should also be noted that, since the predictor operates as a low pass filter, the white noise has little effect on the estimate of the phase jitter.

FIG. 8 shows another possible configuration of decision filter 8 designated as 8'', including an adaptive predictive filter.

Signal $1_n + x_n$ available on line 7 (FIG. 2) is applied to the (+) input of a binary subtractor 70 the (−) input of which receives an estimated value of $x_n$, $\hat{x}_n$. Signal $1_n + x_n - \hat{x}_n$ supplied from the output of subtractor 70 is applied to the input of a detector-separator 71 which provides signal $1_n$ representing the data on line 9 and residual random component $x_n - \hat{x}_n$ on line 72. Signal $x_n - \hat{x}_n$ is applied to the input of an elementary delay element 73 introducing an elementary delay T so that signal $x_{n-1} - \hat{x}_{n-1}$ is available at its output, said signal is applied via line 74, to a first (+) input of a binary adder 75 the second (+) input of which receives signal $\hat{x}_{n-1}$ via line 76. Thus, adder 75 provides at its output, signal $x_{n-1}$ which is applied to the input of an adaptive predictive filter 77 providing signal $\hat{x}_n$ at its output. Signal $\hat{x}_n$ is applied to the (−) input of subtractor 70, via line 78, and to the input of an elementary delay element 80 introducing an elementary delay T via line 79. Signal $\hat{x}_{n-1}$ available from the output of delay element 80, is applied to the second (+) input of adder 75 via line 76.

It should be noted that the function and the operating conditions of adaptive predictive filter 77 are identical to the ones of predictive filter 19 provided in the configuration shown on FIG. 2 and that it is possible to use the Wiener predictive filter described in FIG. 7 as an adaptive predictive filter.

So far, the system has been described as a phase filter in which both decision filters 6 and 8 are connected in cascade. Now, the system will be described as a phase filter in parallel form, in the cases when the predictive filter of the second decision filter is provided with fixed coefficients, and then when said filter is adaptive.

CASE OF A PREDICTIVE FILTER WITH FIXED COEFFICIENTS

Figure 9A:
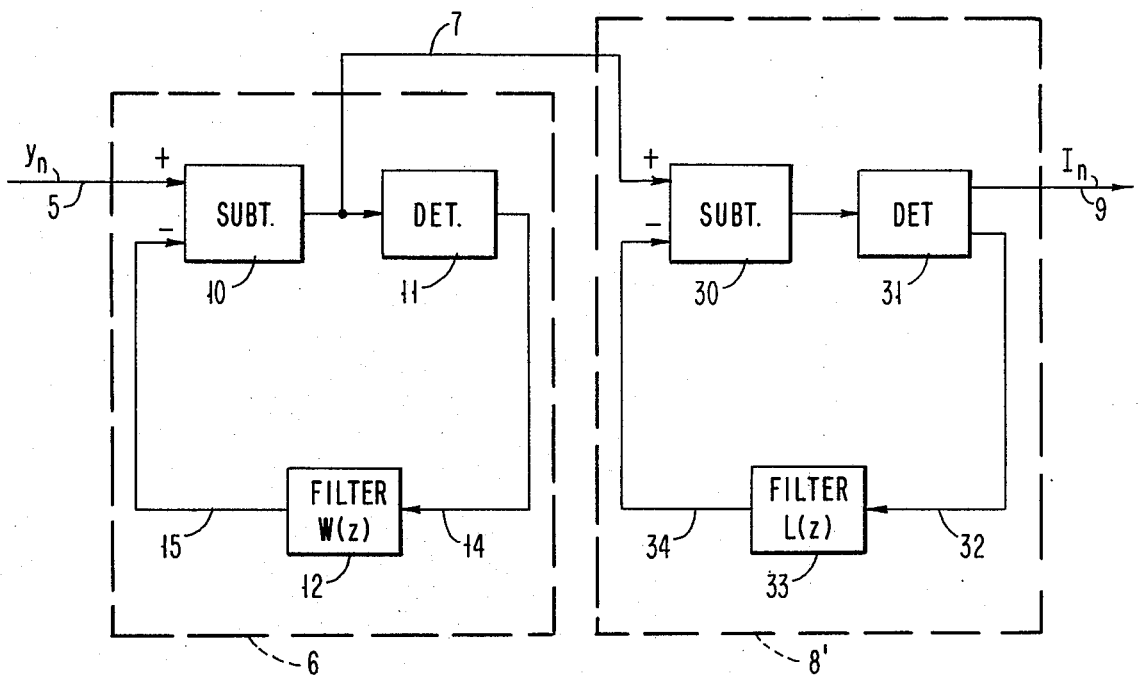
FIG. 9A shows the phase filter of FIG. 2 in which second decision filter 8 is as shown on FIG. 6.
Figure 9B:
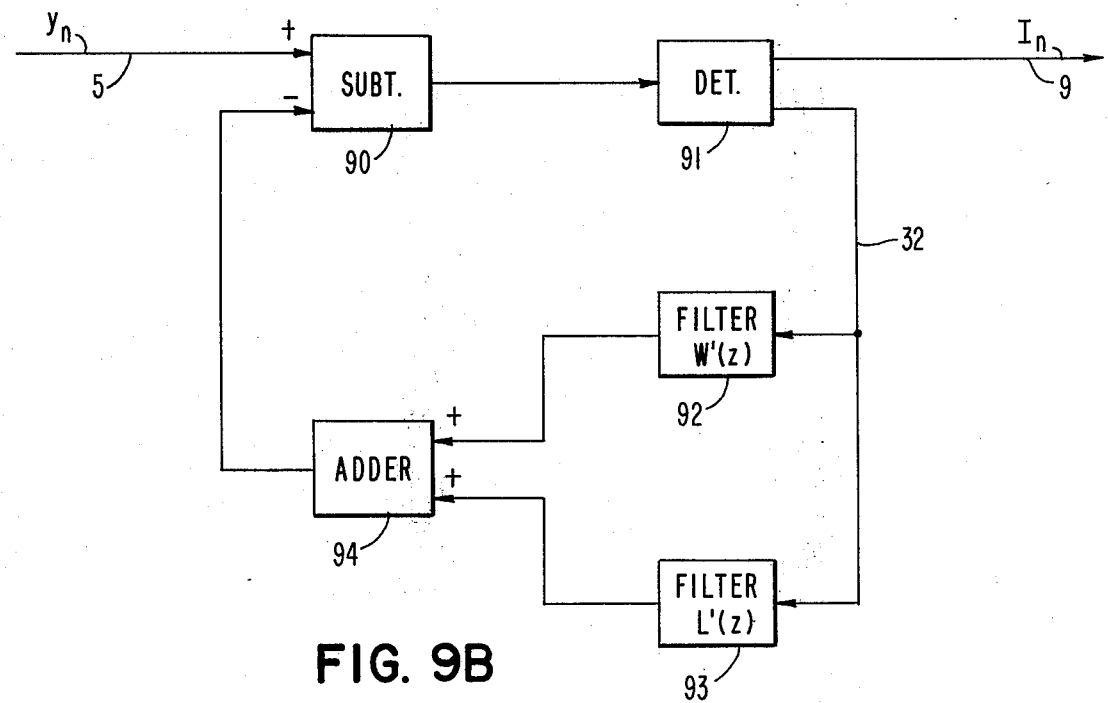
FIG. 9B shows the phase filter in parallel form corresponding to the phase filter in cascade form of FIG. 9A.

For clarity, the phase filter, shown in FIG. 9a, is in cascade form similar to FIG. 2, with the second decision filter 8 having the configuration as shown in FIG. 6. In FIG. 9b, the corresponding parallel form is shown. It should be noted that the same reference numbers are used for the same elements in the structure of FIG. 9a as shown in FIGS. 2 and 6 since the operation of the respective elements has been described before.

In FIG. 9b, signal $y_n$ available on line 5 is applied to the (+) input of a binary subtractor 90 the output of which is connected to the input of a detector-separator 91. The first output of detector-separator 91 connected to line 9, provides the signal representing data $1_n$, while the second output of detector-separator appearing on line 32 is connected in parallel to filters 92 and 93 with transfer functions $W'(z)$ and $L'(z)$, respectively. The outputs of filters 92 and 93 are added in binary adder 94 the output of which is connected to the (−) input of subtractor 90.

Now, it will be shown that the structures of FIGS. 9a and 9b are equivalent by considering their transfer functions.

As seen above, transfer functions $G(z)$ and $H'(z)$ of decision filters 6 and 8 of FIG. 9a are given by relations (19) and (47), respectively, $$G(z) = \frac{1}{1+W(z)}, \quad H'(z) = \frac{1}{1+L(z)}$$

Transfer functions $S_c(z)$ of the cascade configuration shown on FIG. 9a can be expressed as follows $$S_c(z) = G(z) H'(z)$$

or $$S_c(z) = \frac{1}{1+W(z)} \cdot \frac{1}{1+L(z)} \quad (69)$$

Transfer functions $S_p(z)$ of the parallel configuration shown on FIG. 9b can be directly established from the diagram of FIG. 9b $$S_p(z) = \frac{1}{1+W'(z)+L'(z)} \quad (70)$$

In order to make the cascade and parallel forms equivalent, we must have $$S_c(z) = S_p(z)$$

or $$(1+W(z))(1+L(z)) = 1+W'(z) + L'(z) \quad (71)$$

For instance, it is possible to select $W'(z) = W(z)$ and to derive the value of $L'(z)$ from relation (71). It yields $$L'(z) = L(z)(1+W(z)) \quad (72)$$

Substituting $W(z)$ and $L(z)$ by their values derived from (35) and (52') respectively, into (72), we obtain the value of $L'(z)$ in the case of above example 1.

CASE OF THE ADAPTIVE PREDICTIVE FILTER

Figure 10A:
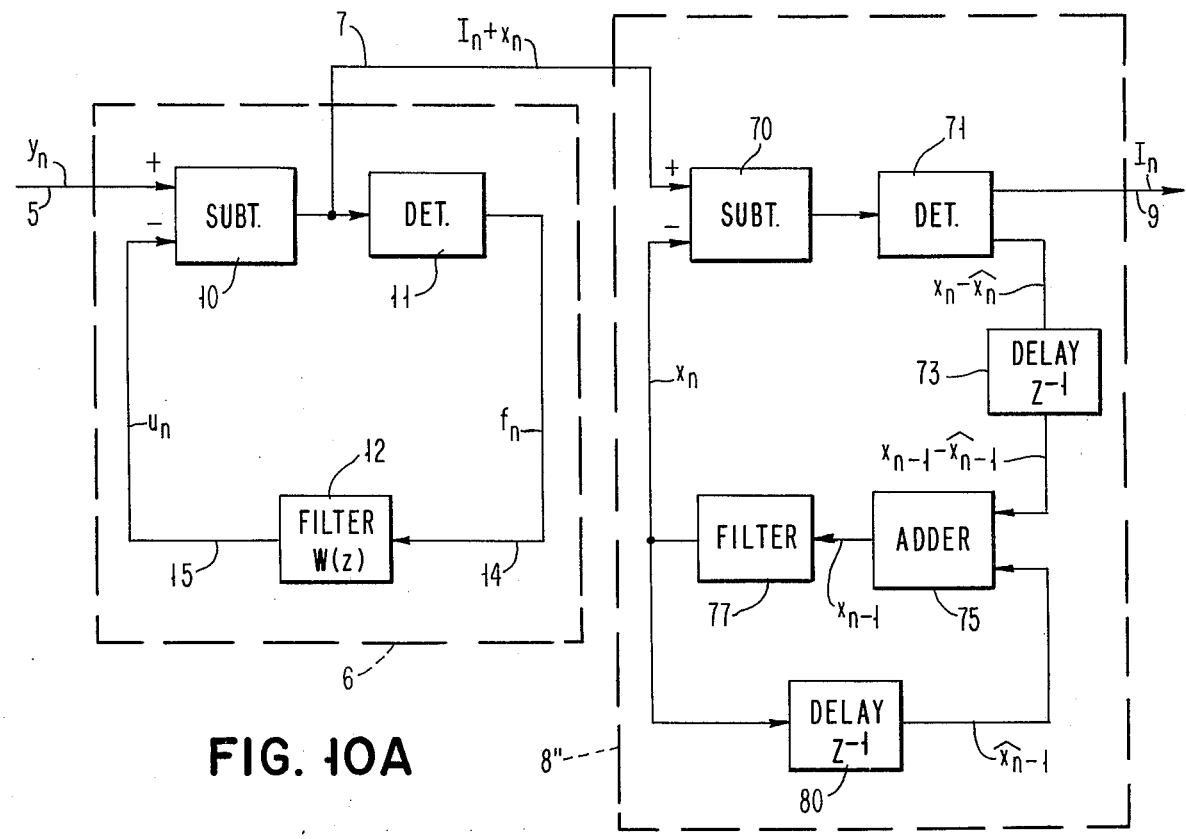
FIG. 10A shows the phase filter of FIG. 2 in which second decision filter 8 is as shown in FIG. 8.
Figure 10B:
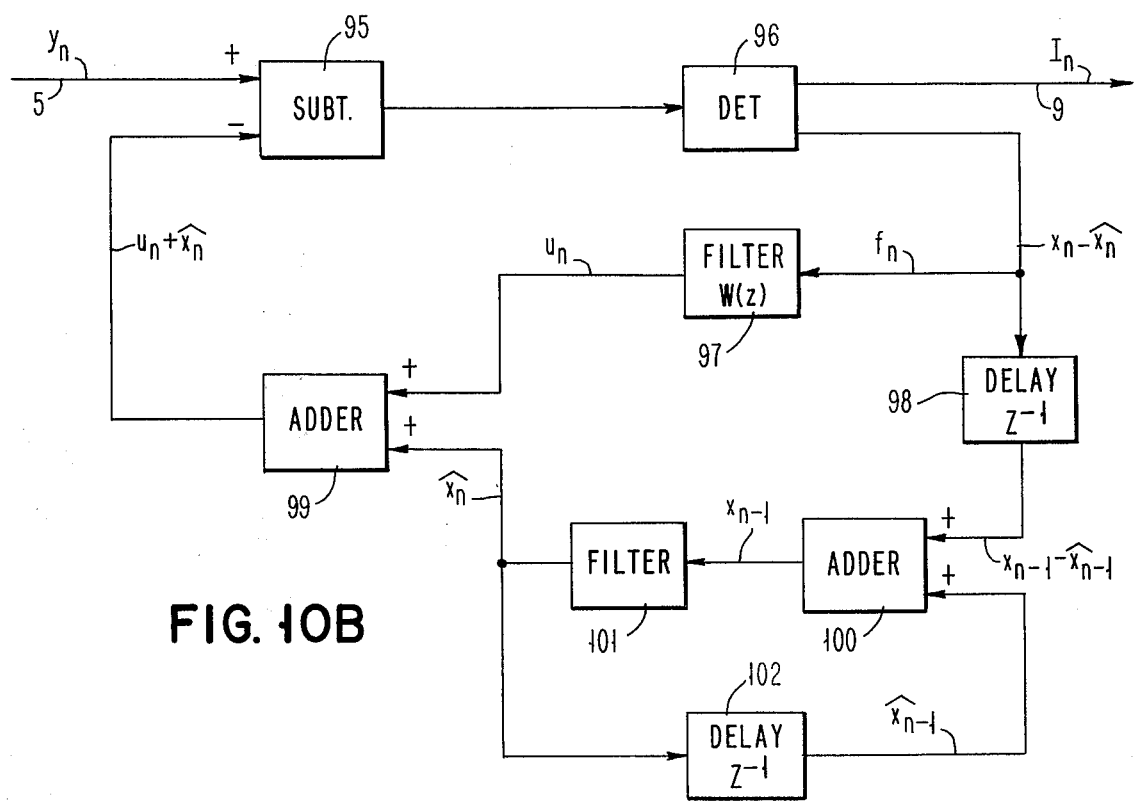
FIG. 10B shows the phase filter in parallel form corresponding to the phase filter in cascade form of FIG. 10A.

For clarity, the phase filter shown on FIG. 10a, is in cascade form similar to FIG. 2, with the second decision filter 8 having the adaptive configuration as shown in FIG. 8. In FIG. 10b the corresponding parallel form is shown. The same reference numbers are used for the same elements in the structure of FIG. 10a as shown on FIGS. 2 and 6, since the operation of the elements has been described before.

In FIG. 10b, signal $y_n$ available on line 5 is applied to the (+) input of a binary subtractor 95 the output of which is connected to the input of a detector-separator 96. The first output of detector-separator 96, connected to line 9, provides the signal representing data $1_n$ while the second output of detector-separator 96 is connected in parallel to the input of filter 97 with transfer function $W(z)$, which is identical to filter 12 of FIG. 2, and to the input of an elementary delay element 98. The output of filter 97 is connected to the first (+) input of a binary adder 99 the output of which is connected to the (−) input of subtractor 95. The output of delay element 98 is connected to the first (+) input of a binary adder 100 the output of which is connected to the input of an adaptive predictive filter 101. The output of filter 101 is connected to the second (+) input of adder 99 and to the input of a delay element 102 the output of which is connected to the second (+) input of adder 100.

It should be noted that the first loop including subtractor 95, detector-separator 96 and filter 97 is identical to first decision filter 6 shown in FIG. 2. The operating conditions of the first loop being identical to the ones of first decision filter 6, in the cascade form.

The second loop including subtractor 95, detector-separator 96, delay elements 98 and 102, adder 100 and adaptive filter 101, is identical to second decision filter 8″ as described with reference to FIG. 8. In the parallel form shown on FIG. 10b, the second output of detector-separator 96 supplies both residual component $f_n$ and residual random component $x_n-\bar{x}_n$. However, as seen above in the description of the operation of first decision filter 8″, residual component $f_n \rightarrow 0$ in steady condition. In steady conditions, the signal applied to the input of delay element 98 is only comprised of $x_n-\bar{x}_n$ and thus, the operating conditions of the second loop are identical to the ones of decision filter 8″ shown in FIG. 8. Thus, the second loop operates exactly as decision filter 8″ of FIG. 8 and adaptive filter 101 can be as the Wiener adaptive predictive filter shown in FIG. 7.

Figure 11:
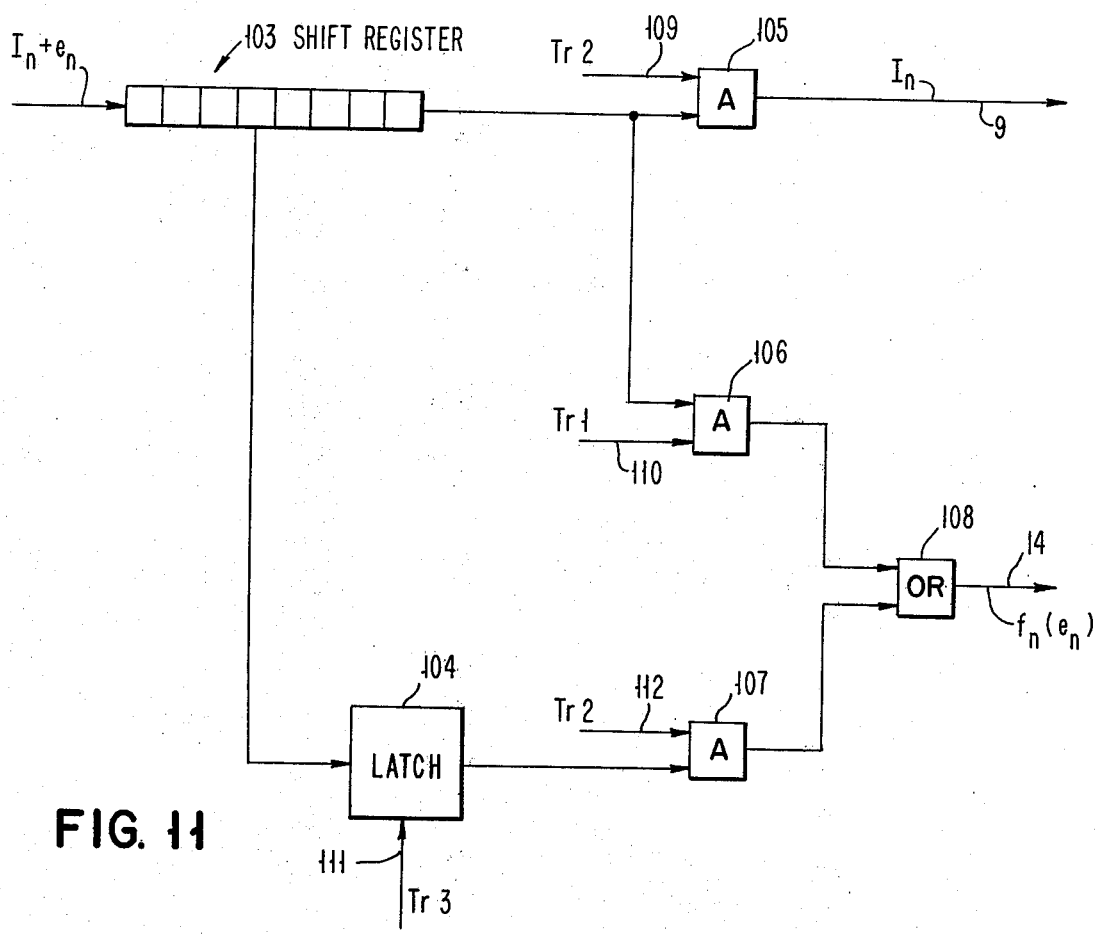
FIG. 11 schematically shows an example of a detector-separator used in this invention.

With reference to FIG. 11, an example of a digital embodiment of the detector-separators used in the invention, will now be described.

It was seen above that the function of the detector-separator used in the invention consists in isolating, from the signal applied thereto, term $1_n$ representing the data, and the residual components marked $f_n$ in the case of the detector-separator of first decision filter 6, and $e_n = x_n - \bar{x}_n$ in the case of the detector-separator of second decision filter 8.

Furthermore, it was seen that $1_n$ is a positive integer (relation (12)).

$$1_n = 0, 1, 2, \ldots (Q-1)$$

and that, when there is no detection error, residual noise component $e_n$, for example, is a fractional number the absolute value of which is comprised between 0 and 1.

It is possible to isolate $1_n$ and $e_n$ in several different ways. If, for instance, the signal applied to the input of the detector-separator is equal to 2.6, it can be arbitrarily said that:

$1_n=3$ and $e_n=-0.04$ i.e., that $-0.5 < e_n < 0.5$
or
$1_n=2$ and $e_n=+0.6$ i.e., that $0 < e_n < 1$ FIG. 11 describes an example of a digital detector-separator using the second possible solution.

Figure 12:
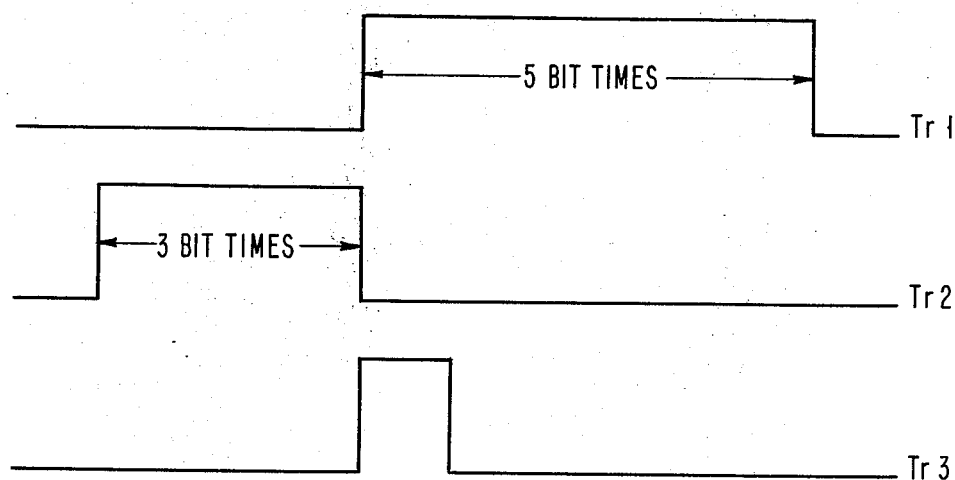
FIG. 12 is a waveshape relationship diagram of certain signals present in the circuit of FIG. 11.

It is assumed that the case of a eight-phase digital data transmission system is considered and that the signal applied to the input of the detector-separator shown on the figure appears as a eight-bit binary word. The device shown on the figure includes an eight-bit shift register 103, a latch 104, three AND gates 105, 106 and 107 and an OR gate 108. The input binary word is applied to the input of shift register 103. The input binary word represents both an integer $1_n$ representing the data, and a fractional number representing the noise. In the case of an eight-phase system, $1_n$ can assume one of the eight values $1_n=0, 1, 2, \ldots, 7$, and can be coded by three bits ($2^3=8$ phases) which are the three high-order bits in the input binary word. In the device shown on FIG. 11, $1_n$ is detected by connecting the output of shift register 103 to a first input of AND gate 105 and by conditioning said AND gate 105 only when the three high-order bits are available at the output of shift register 103. AND gate 105 is controlled by applying an appropriate transfer control signal Tr 2 on the second input of AND gate 105 via line 109. The output of AND gate 105 is connected to line 9 (FIG. 2) from which $1_{l_n}$ is available. The fractional part of the input binary word representing the noise is also obtained by connecting the output of shift register 103 to a first input of AND gate 106 and by enabling the gate when the five low-order bits are available from the output of shift register 103. AND gate 106 is controlled by applying an appropriate transfer control signal Tr 1 on the second input of AND gate 106 via line 110. The five low-order bits transmitted by AND gate 106 are applied to line 14 through OR gate 108. However, these five bits being the five low-order bits of an eight-bit binary word, it is necessary to convert these five bits into an eight-bit binary word. In the device shown on the figure, the five bits to eight bits conversion is readily carried out by repeating the last of the five bits, three times. A tap is provided for this purpose at the fifth bit position of shift register 103 and this tap is connected to the input of latch 104 which reads the bit which is in this bit position when the input binary word is in shift register 103. This reading is controlled by timing signal Tr 3 applied to this latch via line 111. The binary state assumed by latch 104 is transmitted through AND gate 107 and OR gate 108 for three bit times following the first five bits fetched out of shift register 103. AND gate 107 is controlled by applying an appropriate transfer control signal Tr 2 on the second input of AND gate 107 via line 112. The timing sequence for $Tr_1$, $Tr_2$ and $Tr_3$ is illustrated in FIG. 12.

While the invention has been particularly shown and described with reference to the preferred embodiment thereof, it will be understood by those skilled in the art that various changes in form and details may be made therein without departing from the spirit and scope of the invention.

What is claimed is:

1. In a phase filter for minimizing the effects of noise components altering the value of the phase of a digital signal in a digital data transmission system in which the phase of said digital signal can assume Q distinct values representing the data, with said phase filter including two decision filters, with the first decision filter cancelling residual noise components representing the phase intercept component and the phase shift component introduced by frequency shift, and the second decision filter minimizing the random noise component representing phase jitter and white noise, the combination comprising:

input means for receiving said digital signal;
said first decision filter including;
  first means for providing a first difference signal in response to taking the difference between the received digital signal from said input means and a first error signal corresponding to an estimated value of said residual noise component,
  a first detector responsive to said first difference signal for separating the data portion from the residual noise portion of said first difference signal;
  a first linear filter responsive to said residual noise portion of said first difference signal for generating said first error signal,
said second decision filter including;
  second means for providing a second difference signal in response to taking the difference between said first difference signal and a second error signal corresponding to an estimated value of said random noise component,
  second detector responsive to said second difference signal for separating the data portion from the random noise portion of said second difference signal, with a data representative signal being provided at an output, and a second linear filter responsive to said data representative signal for generating said second error signal.

2. In apparatus for minimizing the effects of noise components altering the value of the phase of a digital signal in a digital data transmission system in which the phase of said digital signal can assume Q distinct values representing the data, the combination comprising:

input means for receiving said digital signal;

a first comparison means having first and second inputs and an output, with the first input being connected to said input means for receiving said digital signal and with the second input receiving a first error signal;

a first detection means having an input connected to the output of said first comparison means for detecting the integral and fractional parts of the output signal provided by said first comparison means, with the integral part representing the data and the fractional part representing the noise residual component, with said noise residual signal being provided at an output of said first detection means;

a first linear filter having an input connected to the output of said first detection means for receiving said noise residual component and providing said first error signal at an output, with said first error signal being applied to the second input of said first comparison means for minimizing the residual noise component appearing at the output of said first comparison means;

a second comparison means having first and second inputs and an output with the first input receiving the output signal from said first comparison means and the second input receiving a second error signal;

a second detection means having an input connected to the output of said second comparison means and having an output, with said second detection means detecting the integral and fractional parts of the output signal provided by said second comparison means, with the integral part representing the data and the fractional part representing the random noise component, with said integral part being provided at the output of said second detection means;

first and second delay means, with said first delay means delaying the signal provided at the output of said first comparison means and said second delay means delaying the signal appearing at the output of said second detection means;

a third comparison means, for comparing the delayed signals provided at the respective outputs of said first and second delay means; and a second linear filter having an input for receiving the output signal from said third comparison means and providing said second error signal at an output, with said second error signal being applied to the second input of said second comparison means for minimizing the random noise component appearing at the output of said second comparison means.

3. The combination claimed in claim 2, wherein said input means includes means for multiplying said digital data signal by a coefficient having the value $Q/2\pi$.

4. The combination claimed in claim 3, wherein said first, second and third comparison means each comprises a subtractor.

5. The combination claimed in claim 4, wherein said first linear filter has a transfer function, $$W(z) = \frac{2(1-\alpha)z^{-1} + (\alpha^2-1)z^{-2}}{(1-z^{-1})^2}$$

where, z is the z-transform notation; and $\alpha$ is a coefficient lying within the range $0 < \alpha < 1$.

6. The combination claimed in claim 5, wherein said second linear filter has a transfer function, $$P(z) = \frac{z[N(z^{-1}) - a\, D(z^{-1})]}{N(z^{-1})}$$

where, z is the z transform notation;

$N(z)$ and $D(z)$ are Z-polynomials all of whose zeroes lie outside the unit circle;

$N(z^{-1})$ and $D(z^{-1})$ are the conjugated polynomials of $N(z)$ and $D(z)$ respectively; and $a = N(O)/D(O)$ 7. The combination claimed in claim 5, wherein said second linear filter has a transfer function, $$L(z) = \frac{N(z^{-1}) - a\, D(z^{-1})}{a\, D(z^{-1})}$$

where, z is the z-transform notation;

$N(z)$ and $D(z)$ are z-polynomials all of whose zeroes lie outside the unit circle;

$N(z^{-1})$ and $D(z^{-1})$ are the conjugated polynomials of $N(z)$ and $D(z)$ respectively; and $a = N(O)/D(O)$ 8. In a phase filter to reduce the effects of the noise components altering the phase value of the received signal, in a digital data transmission system in which the phase of the emitted signals can assume Q discrete distinct values representing the data, at the sampling time, the combination comprising:

input means adapted to receive the phase value of the signal received at the sampling times, a subtractor a first input of which is connected to said input means, and a second input of which receives an error signal, a detector-separator connected to the output of said subtractor to separate the integral and fractional parts of the signal provided by said subtractor, said integral and fractional parts respectively corresponding to a data representative signal and to a noise residual component and being respectively supplied to first and second outputs of said detector-separator, a first linear filter connected to said second output of said detector-separator, a second linear filter connected to said second output of said detector-separator, and an adder, two inputs of which are respectively connected to the outputs of said first and second linear filters, and an output for providing said error signal which is connected to said second input of said subtractor.

9. In a phase filter for reducing the effects of the noise components altering the phase value of a received signal, in a digital data transmission system in which the phase of the emitted signals can assume Q discrete distinct values representing the data, at the sampling times, the combination comprising:
- input means adapted to receive the phase value of the signal received at the sampling times;
- a subtractor a first input of which is connected to said input means and a second input of which receives an error signal;
- a detector-separator connected to the output of said subtractor, to separate the integral and fractional parts of the signal supplied by said subtractor, said integral and fractional parts respectively corresponding to a signal representing the data and to a noise residual component which includes a residual random component and being respectively provided to first and second outputs of said detector-separator;
- a first linear filter with transfer function $$W(z) = \frac{2(1-\alpha)z^{-1} + (\alpha^2-1)z^{-2}}{(1-z^{-1})^2}$$

where, $z$ is the $z$-transform notation; and $\alpha$ being a coefficient lying in the range $0 < \alpha < 1$;

connected to said second output of said detector-separator;
- a first delay element introducing an elementary delay T equal to the sampling time period, connected to said second output of said detector-separator;
- a first adder with two inputs, a first input of which is connected to the output of said first delay element;
- an adaptive predictive filter the input of which is connected to the output of said first adder to generate said residual random component from the signals supplied by said first adder;
- a second delay element identical to said first delay element the input of which is connected to the output of said adaptive predictive filter and the output of which is connected to the second input of said first adder; and
- a second adder the inputs of which are respectively connected to the outputs of said first linear filter and said adaptive predictive filter, and the output of which is connected to said second input of said subtractor.

* * * * *